(12) United States Patent
Chiu et al.

(10) Patent No.: US 9,818,711 B2
(45) Date of Patent: Nov. 14, 2017

(54) POST-PASSIVATION INTERCONNECT STRUCTURE AND METHODS THEREOF

(71) Applicant: Taiwan Semiconductor Manufacturing Company, Ltd., Hsin-Chu (TW)

(72) Inventors: Chien-Chia Chiu, Taoyuan County (TW); Ming-Yen Chiu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/755,889

(22) Filed: Jun. 30, 2015

(65) Prior Publication Data

US 2017/0005054 A1 Jan. 5, 2017

(51) Int. Cl.
| | |
|---|---|
| H01L 23/00 | (2006.01) |
| H01L 23/538 | (2006.01) |
| H01L 23/528 | (2006.01) |
| H01L 23/522 | (2006.01) |
| H01L 21/768 | (2006.01) |

(52) U.S. Cl.
CPC ........ *H01L 24/14* (2013.01); *H01L 21/76802* (2013.01); *H01L 21/76877* (2013.01); *H01L 23/528* (2013.01); *H01L 23/5226* (2013.01); *H01L 23/5384* (2013.01); *H01L 23/5386* (2013.01); *H01L 24/03* (2013.01); *H01L 24/08* (2013.01); *H01L 24/11* (2013.01); *H01L 24/19* (2013.01); *H01L 24/20* (2013.01); *H01L 2224/0401* (2013.01); *H01L 2224/04105* (2013.01); *H01L 2224/12105* (2013.01); *H01L 2224/13025* (2013.01); *H01L 2224/32225* (2013.01); *H01L 2224/73267* (2013.01); *H01L 2924/18162* (2013.01)

(58) Field of Classification Search
CPC .......... H01L 24/11; H01L 24/13; H01L 24/14
See application file for complete search history.

(56) References Cited

U.S. PATENT DOCUMENTS

| | | | |
|---|---|---|---|
| 7,098,540 B1 * | 8/2006 | Mohan | .................... H01L 24/03 257/737 |
| 8,361,842 B2 | 1/2013 | Yu et al. | |
| 8,569,886 B2 | 10/2013 | Tu et al. | |
| 8,581,400 B2 | 11/2013 | Liang et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,786,081 B2 | 7/2014 | Chen et al. | |
| 8,803,306 B1 | 8/2014 | Yu et al. | |

(Continued)

FOREIGN PATENT DOCUMENTS

KR 20150051304 5/2015

*Primary Examiner* — Daniel Whalen
(74) *Attorney, Agent, or Firm* — Haynes and Boone, LLP

(57) ABSTRACT

The semiconductor device includes a die that contains a substrate and a bond pad. A connective layer is disposed over the die. The connective layer includes a supporting pad and a conductive channel. A portion of the conductive channel passes at least partially through the supporting pad. At least one dielectric region is interposed between the supporting pad and the portion of the conductive channel.

20 Claims, 27 Drawing Sheets

(56) References Cited

U.S. PATENT DOCUMENTS

| | | |
|---|---|---|
| 8,809,996 B2 | 8/2014 | Chen et al. |
| 8,829,676 B2 | 9/2014 | Yu et al. |
| 8,877,554 B2 | 11/2014 | Tsai et al. |
| 8,957,503 B2 | 2/2015 | Yang et al. |
| 9,449,943 B2 | 9/2016 | Lin et al. |
| 2004/0126513 A1 | 7/2004 | Bekele et al. |
| 2008/0048322 A1 | 2/2008 | Baek et al. |
| 2011/0291288 A1 | 12/2011 | Wu et al. |
| 2012/0025401 A1 | 2/2012 | Lee et al. |
| 2012/0241985 A1* | 9/2012 | Topacio .............. H01L 24/03 257/782 |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0273731 A1 | 10/2013 | Gulpen et al. |
| 2013/0307140 A1 | 11/2013 | Huang et al. |
| 2014/0001635 A1* | 1/2014 | Chen .................. H01L 24/11 257/751 |
| 2014/0004660 A1 | 1/2014 | Sung et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0014846 A1* | 1/2015 | Lai .................... H01L 24/05 257/737 |
| 2015/0076713 A1 | 3/2015 | Tsai et al. |

* cited by examiner

POST-PASSIVATION INTERCONNECT STRUCTURE AND METHODS THEREOF

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Accordingly, the semiconductor dies need to have increasingly greater numbers of I/O pads packed into smaller areas, and the density of the I/O pads rises quickly. As a result, the packaging of the semiconductor dies becomes more difficult, which adversely affects the yield of the packaging. Post-passivation interconnect (PPI) structures have been used to route the connections from the semiconductor dies, increase numbers of I/O pads, redistribute the bump layout, and/or facilitate contact to the package.

Existing PPI structures can suffer from shortcomings in circuit routing. For example, existing PPI structures have less flexible circuit routing capabilities. As a result, more PPI layers may be needed to provide more routing area to overcome signal integrity issues, which may need a smaller process window and incurs higher cost.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
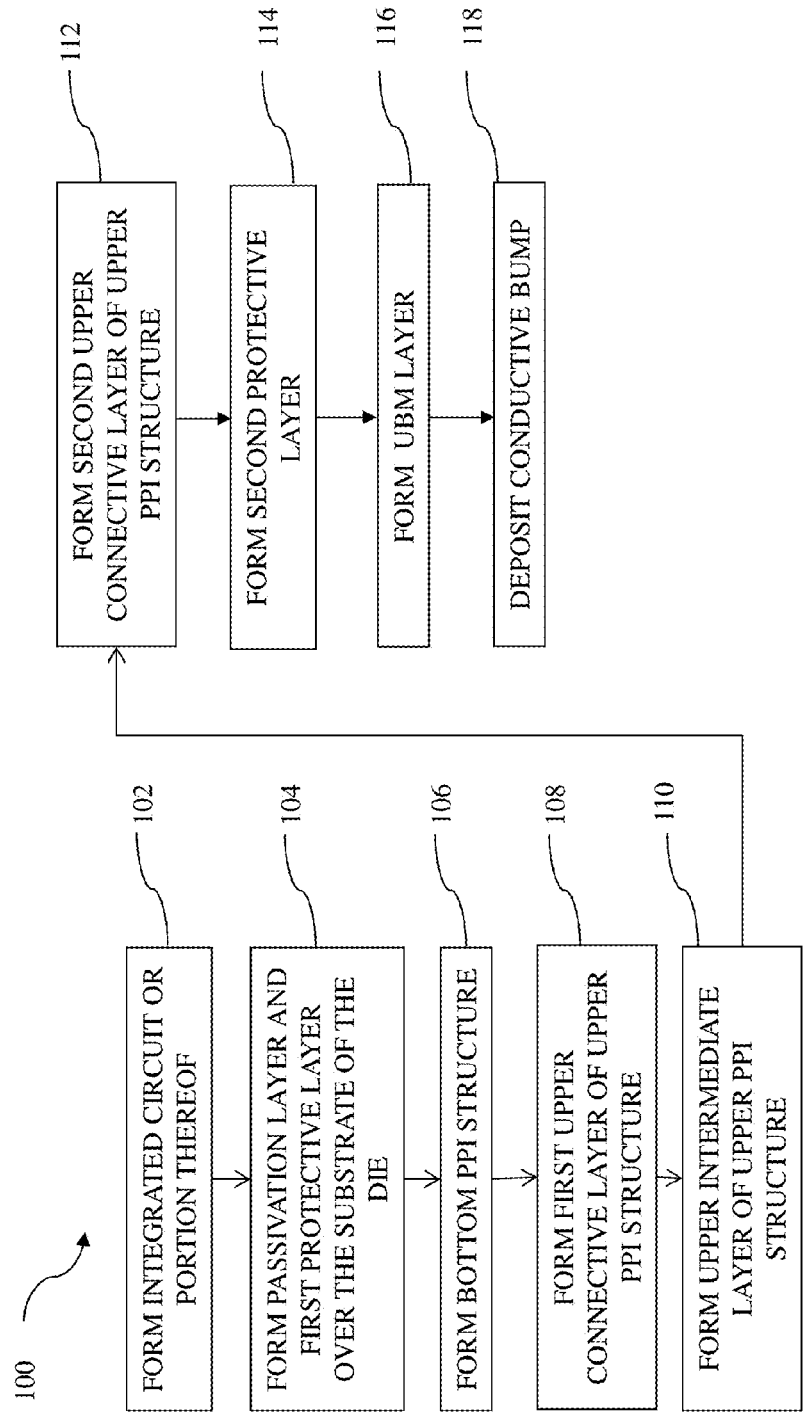
FIG. 1 is a flowchart illustrating an embodiment of a method of forming a semiconductor device or portion thereof according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of an integrated fan-out (InFO) package with PPI structures including fan-out redistribution lines. One of ordinary skill may recognize other examples of semiconductor devices that may benefit from aspects of the present disclosure. For example, some embodiments as described herein may also be applied to wafer level packages with PPI structures including fan-in redistribution lines. For further example, some embodiments as described herein may also be applied to three-dimensional (3D) packages, where chips are stacked vertically on each other.

A technique for forming a PPI structure is described below with reference to FIGS. 1-14. Throughout the various views and illustrative embodiments, like reference numbers are used to designate like elements.

Referring to FIG. 1, illustrated therein is a flowchart of one embodiment of a method 100 used to form a PPI structure. The method 100 begins at block 102, where a device or portion thereof is formed, or partially formed, on a substrate. Referring to the examples of FIG. 2, in an embodiment of block 102, a device 200 is provided. The device 200 includes a substrate 202 (also referred to as a wafer), a plurality of semiconductor devices 204 formed in or on the substrate 202, an interconnect structure 210 formed over one side of the substrate 202, and a plurality of conductive pads 220 formed over the interconnect structure 210.

The substrate 202 may be a semiconductor substrate such as a silicon substrate. The substrate 202 may include various layers, including conductive or insulating layers formed over a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, the substrate may optionally include an epitaxial layer (epi-layer), may be strained for performance enhancement, may include a silicon-on-insulator (SOI) structure, and/or have other suitable enhancement features.

Figure 2:
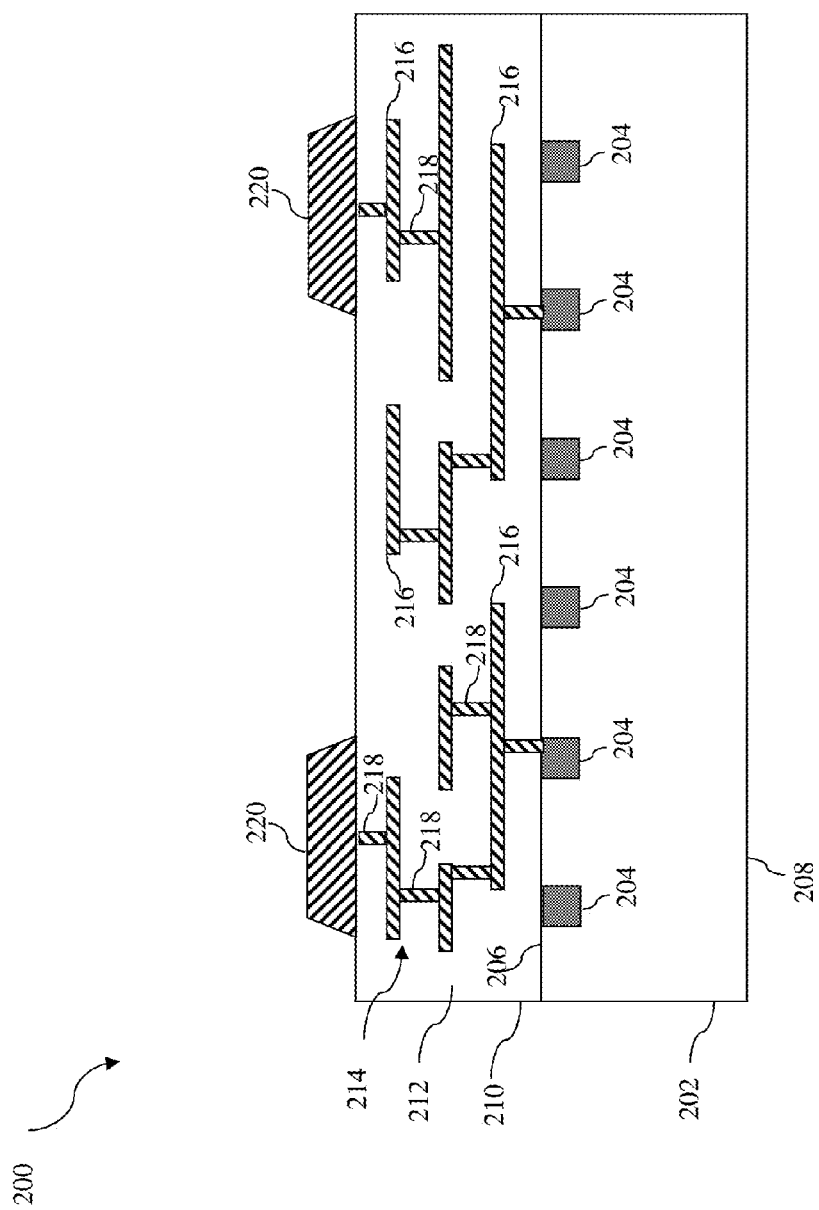
FIG. 2 is a cross-sectional view of a portion of a semiconductor device according to an embodiment of the present disclosure.

The semiconductor devices 204 formed in or on the substrate 202 may include active components such as Field Effect Transistors (FETs) or Bipolar Junction Transistors (BJTs), or passive components such as resistors, capacitors, or inductors. The device 200 may include millions or billions of these semiconductor devices, but only a few are shown in FIG. 2 for the sake of simplicity.

The interconnect structure 210 is formed over one side of the substrate 202. Referring to the example of FIG. 2, the substrate 202 has a front side 206 (or front surface) and a back side (or back surface) 208. The front side and the back side are relative, and interconnect structures can be formed on either the front side or the back side, or both. In an example, the interconnect structure 210 is formed over the front side 206 of the substrate 202. The interconnect structure 210 may also be considered a part of the substrate 202. The interconnect structure 210 includes a plurality of patterned dielectric layers and conductive layers that provide interconnections (e.g., wiring) between the various doped features, circuitry, and input/output of the device 200. For example, the interconnect structure 210 includes an interlayer dielectric (ILD) 212 and a multilayer interconnect (MLI) structure 214. The ILD 212 may include silicon oxide, low-k dielectric material, other suitable dielectric materials, or combinations thereof.

The MLI structure 214 includes conductive interconnect features such as contacts, vias and conductive lines. For purposes of illustration, a plurality of conductive lines 216 (also referred to as metal lines or metal interconnects) and contacts/vias 218 are shown in FIG. 2, it being understood that the conductive lines 216 and contacts/vias 218 illustrated are merely exemplary, and the actual positioning, quantity, and configuration of the conductive lines 216 and contacts/vias 218 may vary depending on design and manufacturing needs. The MLI structure 214 includes conductive lines formed by suitable methods including physical vapor deposition (PVD), chemical vapor deposition (PVD), atomic layer deposition (ALD), plating, sputtering and/or other suitable processes. Typically, the MLI structure 214 is defined by suitable processes such as photolithography and etching processes. The conductive lines and/or vias of the MLI structure 214 may include multiple layers such as, barrier layers, seed layers, adhesion layers, and/or other suitable features. In an embodiment, the MLI structure 214 includes conductive lines 216 of copper. Other suitable compositions for the MLI structure 214 includes aluminum, aluminum/silicon/copper alloy, metal silicide (such as nickel silicide, cobalt silicide, tungsten silicide, tantalum silicide, titanium silicide, platinum silicide, erbium silicide, palladium silicide, or combinations thereof), copper alloy, titanium, titanium nitride, tantalum, tantalum nitride, tungsten, polysilicon, gold, silver, and/or combinations thereof.

A plurality of conductive pads 220 are formed over the interconnect structure 210. The conductive pads 220 may be referred to as bonding pads. The conductive pads 216 may include a metal material, for example aluminum (Al), but may include other conductive materials in alternative embodiments. The conductive pads 220 are each electrically coupled to at least one of the semiconductor devices 204, so that electrical connections between the semiconductor devices 204 and external devices may be established. The coupling may be done through the interconnect structure 210 including one or more conductive lines 216 and one or more contacts/vias 218.

Figure 3A:
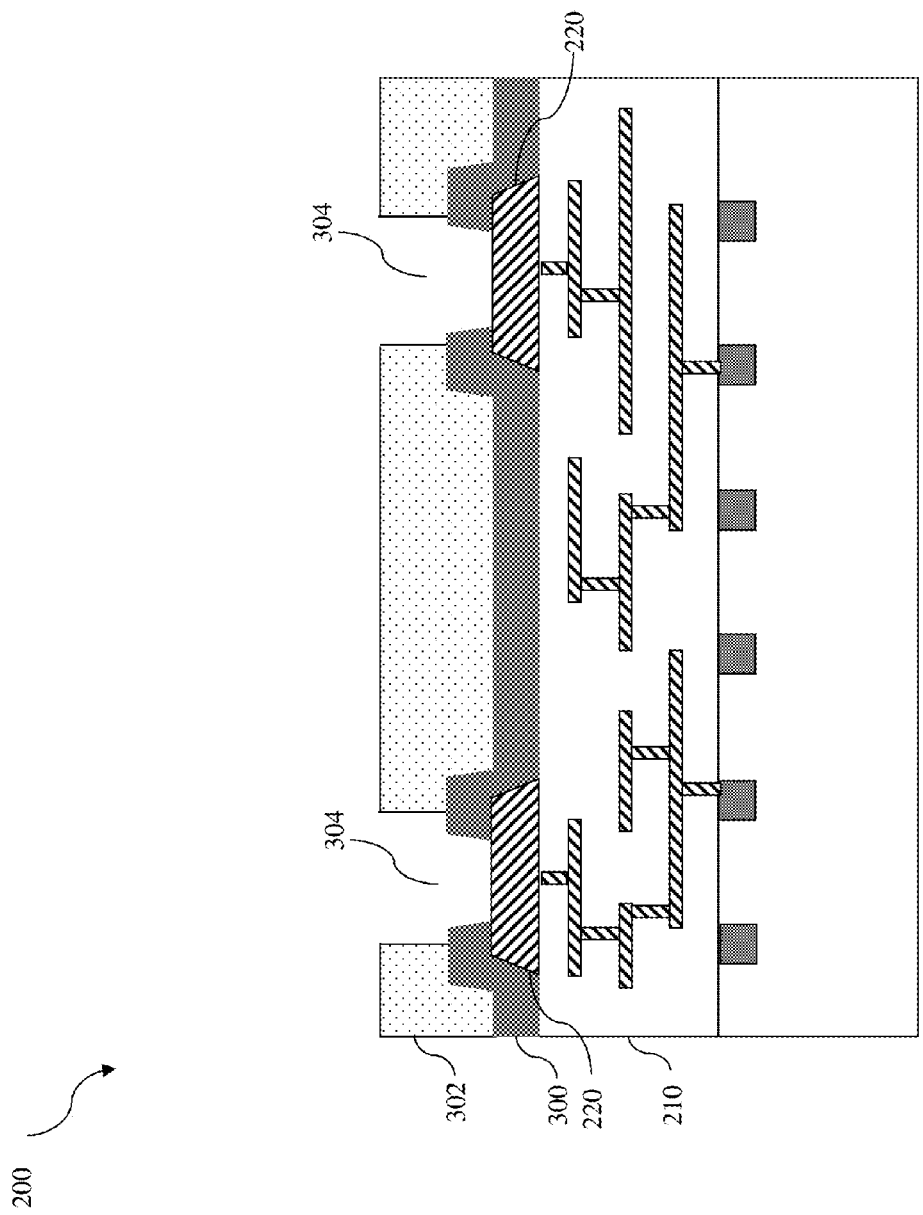
FIGS. 3A-B are cross-sectional views of a portion of a semiconductor device after forming a passivation layer and a first protective layer according to some embodiments.

The method 100 proceeds to block 104 in which a passivation layer is formed over a substrate that contains a plurality of semiconductor devices. In an embodiment of block 104, a first protective layer is formed over the passivation layer over the conductive pads. FIG. 3A illustrates a device 200 where a passivation layer 300 is formed over the interconnect structure 210 and over the conductive pads 220, and a first protective layer 302 is formed over the passivation layer 300 over the conductive pads 220. Openings 304 are formed in portions of the passivation layer 300 and the first protective layer 302 and expose portions of the conductive pads 220.

As illustrated in the example of FIG. 3A, the passivation layer 300 can cover the peripheral portion of the conductive pads 220, while exposing at least a portion of conductive pads 220 through respective openings 304. The passivation layer 300 can provide a sealing function for the various features and devices of the device 200, so that they are less likely to be eroded or damaged by external components. For example, the passivation layer 300 can prevent moisture, dust, and other contaminant particles from reaching inside the device 200, which may degrade the performance of the device 200 and/or shorten its lifespan. In an embodiment, the passivation layer 300 has a thickness that is in a range between about 8 micron (μm) and about 30 μm.

The passivation layer 300 may include a silicon nitride or a silicon oxide material, or combinations thereof. The passivation layer 300 may be formed by a process that may include chemical vapor deposition (CVD), physical vapor deposition (PVD), atomic layer deposition (ALD), plasma enhanced chemical vapor deposition (PECVD), spin-coating, combinations thereof, and/or other suitable techniques.

In an embodiment of the block 104 a protective layer is disposed on the passivation layer. Using the example of FIG. 3A, a first protective layer 302 is formed over the passivation layer 300, exposing at least a portion of conductive pads 220 through respective openings 304.

The first protective layer 302 may be a polymer layer. In a further embodiment, the first protective layer 302 is a polyimide layer. The first protective layer 302 may include polymers of imide monomers, for example pyromellitic dianhydride monomers. In an embodiment, the first protective layer 302 has a thickness that is in a range between about 5 µm and about 30 µm. In some embodiments, the first protective layer 302 is formed using a spin-on coating method and/or a suitable deposition method. It is patterned and etched, for example, through a wet etching or a dry etching process, and exposes at least a portion of conductive pads 220 through respective openings 304.

Figure 3B:
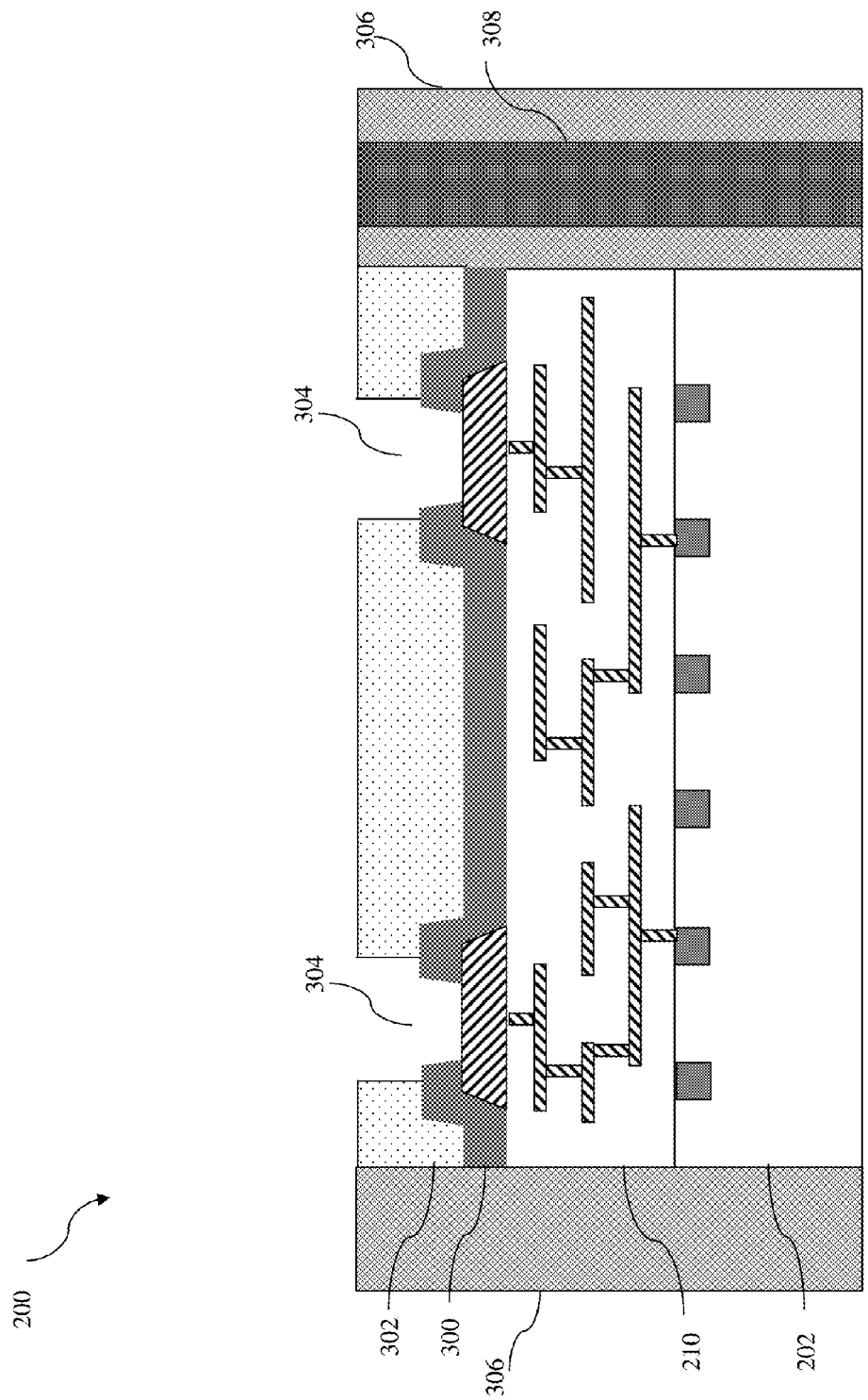

Referring to the example of FIG. 3B, in an embodiment, a molding material 306 is disposed around the substrate 202, the interconnect structure 210, the passivation layer 300, and the first protective layer 302 of the device 200. The molding material 306 may include a molding compound, a molding underfill, an epoxy, a resin, and/or other suitable material. The top surface of the molding material 306 may be of the same height as the top surface of the top surfaces of the first protective layer 302. The molding material 306 may include a Through-Substrate-Via (TSV) structure 308 that may provide through die connections in 3D packages.

The method 100 proceeds to block 106 in which a bottom PPI structure is formed. A bottom PPI structure is a plurality of conductive lines and surrounding dielectric layers formed over the first passivation layer and the conductive pads. In some embodiments, the bottom PPI structure is connected to the conductive pads. In some embodiments, the bottom PPI structure may function as power lines, re-distribution lines (RDL), inductors, capacitors, dummy lines, ground lines, signal lines, or other functions or any passive components.

Figure 4:
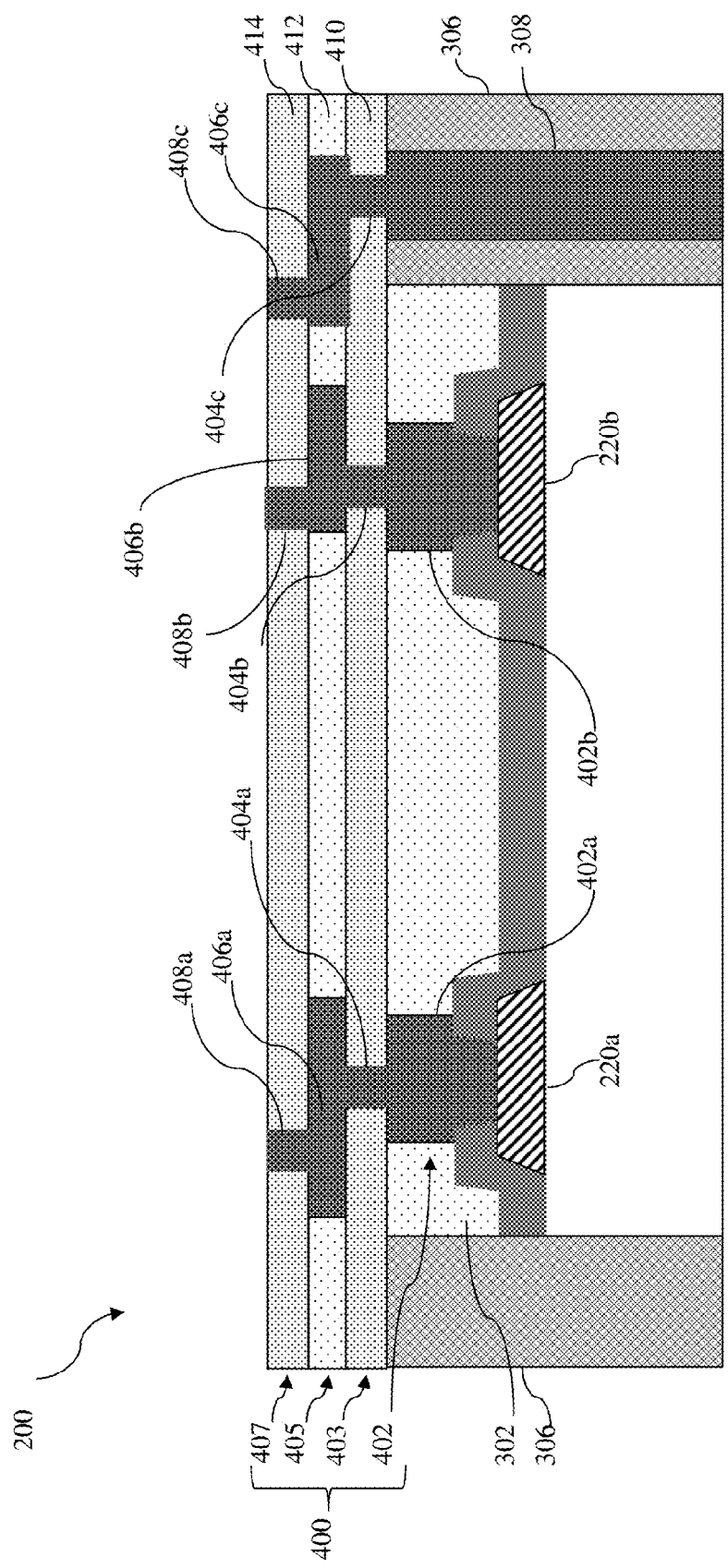
FIG. 4 is a cross-sectional view of a portion of a semiconductor device after forming a bottom PPI structure according to some embodiments.

As an example of block 106, FIG. 4 illustrates the device 200, where a bottom PPI structure 400 is formed over the first protective layer 302 and molding material 306. The bottom PPI structure 400 includes conductive regions 402, a first bottom connective layer 403 (also referred to as a first bottom RDL layer), a second bottom connective layer 405 (also referred to as a second bottom RDL layer), and a third bottom connective layer 407 (also referred to as a third bottom RDL layer).

The conductive regions 402 fill the respective openings formed above the conductive pads (e.g., bonding pads). As illustrated in the example of FIG. 4, the conductive regions 402 includes conductive regions 402a and 402b. The conductive regions 402a and 402b fill the respective openings above the conductive pads 220a and 220b, and are in direct physical contact with and electrically connected to the conductive pads 220a and 220b respectively.

The first bottom connective layer 403 of the bottom PPI structure 400 is formed over the first protective layer 302, the molding material 306, and the conductive regions 402. The first bottom connective layer 403 includes conductive contacts/vias 404, including conductive contacts/vias 404a, 404b, and 404c. The conductive contacts/vias 404 may be connected to the conductive regions 402 and TSV structure 308. In an embodiment, the conductive contacts/vias 404a, 404b, and 404c are in direct physical contact with and electrically connected to the conductive region 402a, conductive region 402b, and TSV structure 308 respectively. The first bottom connective layer 403 further includes an insulating layer 410. In some embodiments, the insulating layer 410 surrounds the conductive contacts/vias 404 and electrically insulates the conductive contacts/vias 404.

The second bottom connective layer 405 of the bottom PPI structure 400 is formed over the first bottom connective layer 403, and includes conductive lines 406 including exemplary conductive lines 406a, 406b, and 406c. The conductive lines 406 may be connected to the conductive contacts/vias 404 in the first bottom connective layer 403. In an embodiment, the conductive lines 406a, 406b, and 406c are in direct physical contact with and electrically connected to the conductive contacts/vias 404a, 404b, and 404c respectively. The second bottom connective layer 405 further includes an insulating layer 412. In some embodiments, the insulating layer 412 surrounds the conductive lines 404 and electrically insulates portions of the conductive lines 404.

The third bottom connective layer 407 of the bottom PPI structure 400 is formed over the second bottom connective layer 405, and includes conductive contacts/vias 408, including exemplary conductive contacts/vias 408a, 408b, and 408c. The conductive contacts/vias 408 are connected to the conductive lines 406 in the second bottom connective layer. In some embodiments, the conductive contacts/vias 408a, 408b, and 408c are in direct physical contact with and electrically connected to the conductive lines 406a, 406b, and 406c respectively. The third bottom connective layer 407 further includes an insulating layer 414. In some embodiments, the insulating layer 414 surrounds conductive contacts/vias 408 and electrically insulates the conductive contacts/vias 408.

The plurality of bottom connective layers 403, 405, and 407 are exemplary only and not intended to be limiting beyond what is specifically recited in the claims that follow. The bottom PPI structure 400 may include any number of layers. In some embodiments, the bottom PPI structure 400 may include a nickel-containing layer on top of a copper-containing layer. The conductive structure of the bottom PPI structure 400, including the conductive regions 402, the conductive contacts/vias 404, the conductive lines 406, and the conductive contacts/vias 408, may include, but is not limited to, for example copper, aluminum, copper alloy, or other suitable conductive materials. The insulating structure of the bottom PPI structure 400, including the insulating layers 410, 412, and 414, may include silicon oxide, a material having a low dielectric constant such as a dielectric constant (k) less than about 2.5 (e.g., extra low k (ELK)), silicon nitride, silicon oxynitride, polyimide, spin-on glass (SOG), fluoride-doped silicate glass (FSG), undoped silica glass (USG), carbon doped silicon oxide (SiOC), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials.

The bottom PPI structure 400 may include conductive lines and contacts/vias formed by suitable methods including physical vapor deposition (PVD), chemical vapor deposition (PVD), atomic layer deposition (ALD), plating, sputtering and/or other suitable processes. The bottom PPI structure 400 may be defined by suitable processes such as photolithography and etching processes.

The method 100 proceeds to block 108 in which a first upper connective layer (also referred to as a first upper RDL layer) of an upper PPI structure is formed. In addition to the first upper connective layer, the upper PPI structure further includes an upper intermediate layer and a second upper connective layer, which will be discussed in detail below with reference to FIGS. 6A-7D. In some embodiments, the upper PPI structure may function as power lines, re-distribution lines (RDL), inductors, capacitors, dummy lines, ground lines, signal lines, or other functions or any passive components. In some embodiments, the upper PPI structure may be used to support bump structures and distribute mechanical stress, which will be discussed below with reference to FIGS. 9A-9C.

Figure 5A:
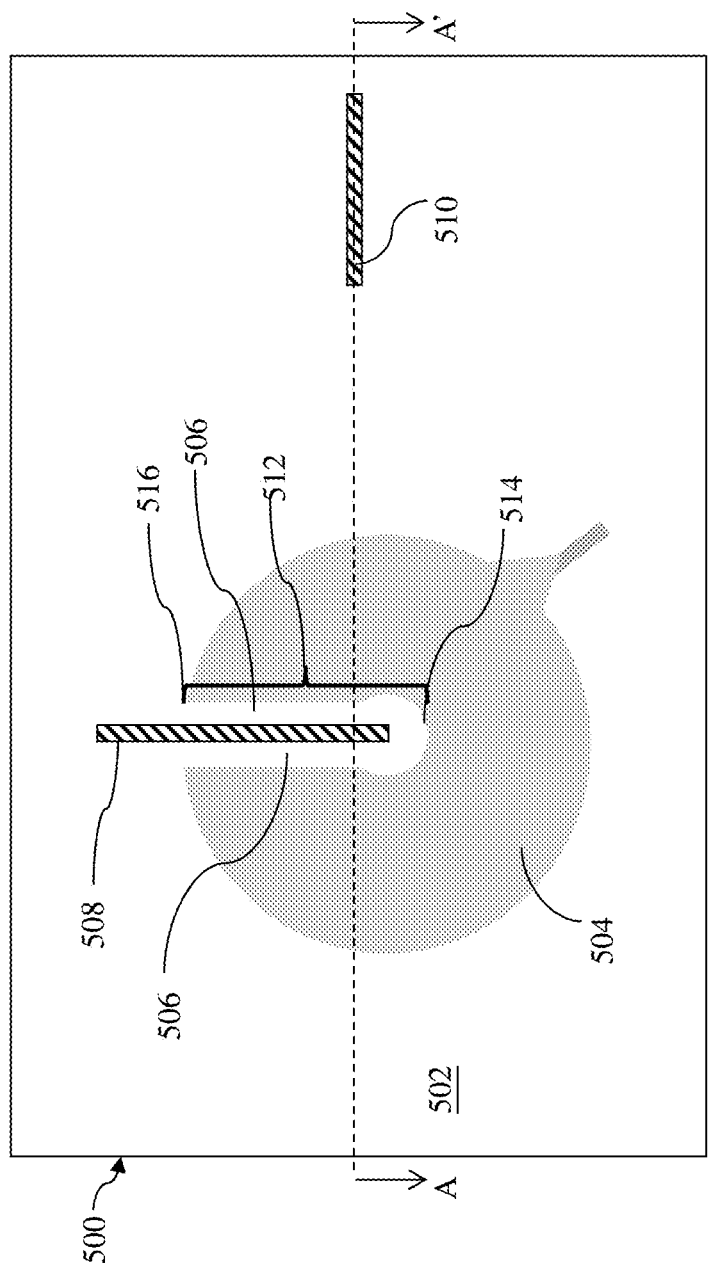
FIG. 5A is a top view of a portion of a semiconductor device after forming a first upper connective layer of an upper PPI structure according to some embodiments.
Figure 5B:
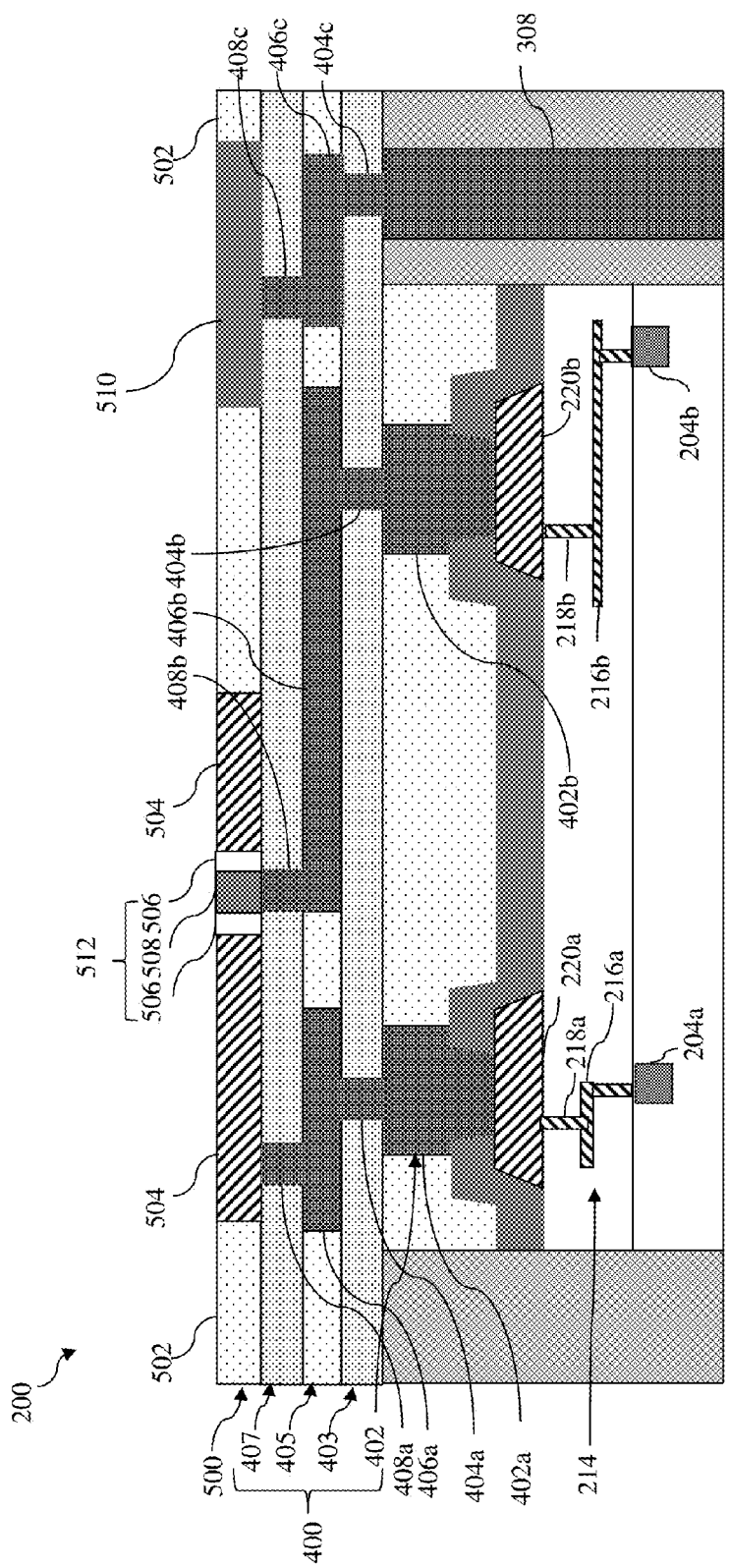
FIG. 5B is a cross-sectional view of a portion of a semiconductor device along line A-A' of FIG. 5A according to some embodiments.

Referring now to FIGS. 5A-5B, merely for illustrative purposes, FIGS. 5A-5B show the device 200 after the formation of the first upper connective layer 500. FIG. 5A provides a top view of a portion of the first upper connective layer 500. FIG. 5B is a cross-sectional view of a portion of the device 200 along the line A-A' of FIG. 5A according to some embodiments. Referring to block 108 and to the examples of FIGS. 5A-5B, the first upper connective layer 500 includes a dielectric region 502. The first upper connective layer 500 further includes conductive components including a supporting pad 504 with an opening 512, conductive channels (also referred to as conductive paths) including a conductive channel 508, and conductive lines including a conductive line 510.

As illustrated in the example of FIG. 5A, there is an opening 512 in the supporting pad 504. The opening 512 extends from an edge 516 of the supporting pad 512 and a point 514 within the supporting pad 504. The opening 512 includes a first portion of the conductive channel 508 that passes partially through the supporting pad 504. The opening 512 further includes a dielectric region 506, which is disposed between the first portion of the conductive channel 508 and the supporting pad 504. In some embodiments, the supporting pad 504 is not in direct physical contact with the conductive channel 508. In some embodiments, the supporting pad 504 is electrically isolated from the conductive channel 508 at least by the dielectric region 506. In various embodiments, the supporting pad 504 may have zero opening or one or more openings as discussed in more detail below with reference to FIGS. 11A-11E. In some embodiments, the first upper connective layer 500 may include a supporting pad 504 that has one or more openings. The one or more openings may include one or more conductive channels that partially or entirely pass through the supporting pad 504, and one or more dielectric regions that isolate the one or more conductive channels from the supporting pad 504. In various embodiments, the supporting pad 504 may be of various shapes (e.g., circles, rectangles, or shapes including multiple portions separated by dielectric regions and/or conductive channels). In various embodiments, the supporting pad 504 may be used for power supply wiring, dummy wiring, ground wiring, signal wiring, or other functions. In some embodiments, the supporting pad 504 may be used to provide mechanical support for a bump structure that will be formed over the supporting pad 504, increase the strength of the upper PPI structure, and distribute mechanical stress, which will be discussed below with reference to FIGS. 9A-9C.

The conductive components of the first upper connective layer 500, including the supporting pad 504, the conductive channel 508, and the connective line 510, may be in contact with and connected to various components in the bottom PPI structure 400. In some embodiments, the supporting pad 504 is connected to the conductive pad 220a, while the conductive channel 508 is connected to the conductive pad 220b. In the illustrated example of FIG. 5B, a bottom surface of the supporting pad 504 is in direct physical contact with a top surface of the conductive contact/via 408a. The supporting pad 504 is electrically connected by a contiguous conductive path to the conductive pad 220a through the bottom PPI structure 400 including using the conductive contacts/vias 408a and 404a, the conductive line 406a, and the conductive region 402a. Furthermore, the supporting pad 504 is electrically connected to a semiconductor device 204a (e.g., a transistor or a diode) by a contiguous conductive path through the conductive pad 220a and the MLI structure 214 including using a contact/via 218a and a conductive line 216a. Also illustrated in the example of FIG. 5B is that the conductive channel 508 is connected to the conductive pad 220b through the bottom PPI structure 400 including using the conductive contacts/vias 408b and 404b, the conductive line 406b, and the conductive region 402b, which is different from the connection discussed above connecting the supporting pad 504 and the conductive pad 220a. Furthermore, the supporting pad 504 is electrically connected by a contiguous conductive path to a semiconductor device 204b (e.g., a transistor or a diode) through the conductive pad 220b and the MLI structure 214 including using a contact/via 218b and a conductive line 216b. Also, in the illustrated example of FIG. 5B, the conductive line 510 is connected to the TSV structure 308. As illustrated in FIG. 5B, a bottom surface of the conductive line 510 is in direct physical contact with a top surface of the conductive contact/via 408c. The conductive line 510 is electrically connected to the TSV structure 308 through the bottom PPI structure 400 including using the conductive contacts/vias 408c and 404c, and the conductive line 406c.

Numerous other embodiments providing connections between the supporting pad 504 and the semiconductor devices 204 in the substrate 202 and/or the TSV structure 308 may be used. Furthermore, numerous other embodiments providing connections between the conductive channel 508 and the semiconductor devices 204 in the substrate 202 and/or the TSV structure 308 may be used. It is noted that the configurations and connections illustrated in FIGS. 5A-5B are exemplary only and not intended to be limiting beyond what is specifically recited in the claims that follow. It will be understood by those skilled in the art that other configurations and connections may be desirable and chosen for a given device design or process technology, or other process conditions. In some embodiments, the configurations and connections are chosen based on circuit routing and/or signal integrity requirements. In an embodiment, the supporting pad 504 is connected by a contiguous conductive path (a conductive line or via) to a first semiconductor device 204 (e.g., a transistor or a diode) in the substrate 202, and the conductive channel 508 is not connected by a contiguous conductive path (a conductive line or via) to the first semiconductor device 204 in the substrate 202. In a further embodiment, the supporting pad 504 is connected by a contiguous conductive path (a conductive line or via) to a first bonding pad 220a, and the conductive channel 508 is not connected by a contiguous conductive path (a conductive line or via) to the first bonding pad 220a. In an embodiment, the conductive channel 508 is connected by a contiguous conductive path (a conductive line or via) to a second semiconductor device 204 (e.g., a transistor or a diode) in the substrate 202, and the supporting pad 504 is not connected by a contiguous conductive path (a conductive line or via) to the second semiconductor device 204 in the substrate 202. In a further embodiment, the conductive channel 508 is connected by a contiguous conductive path (a conductive line or via) to a second bonding pad 220b, while the supporting pad 504 is not connected by a contiguous conductive path (a conductive line or via) to the second bonding pad 220b. In yet another embodiment, the supporting pad 504 is connected by a contiguous conductive path (a conductive line or via) to a first conductive component of the MLI structure 214, and the conductive channel 508 is connected by a contiguous conductive path (a conductive line or via) to a second conductive component of the MLI structure 214 that is different from the first conductive component of the MLI structure 214. In yet another embodiment, one of the supporting pad 504 and the conductive channel 508 is connected by a contiguous conductive path to TSV structures 308 providing through-die connections in 3D packages, which is discussed in detail below with reference to FIG. 14, while the other one of the supporting pad 504 and the conductive channel 508 is not connected by a contiguous conductive path to the TSV structures 308.

In an embodiment, the bottom PPI structure 400 in a device 200 does not include one or more of the bottom connective layers 403, 405, and 407, for example, the first upper connective layer 500 may be formed directly over the first protective layer 302, the molding material 306, and the conductive regions 402. For example, bottom surfaces of the first upper connective layer 500 may be in direct physical contact with the top surfaces of the first protective layer 302, the molding material 306, and the conductive regions 402 respectively.

In an embodiment, conductive components in the first upper connective layer 500, including the supporting pad 504, the conductive channel 508, and/or the conductive line 510, may be in direct physical contact with conductive lines and/or conductive contacts/vias formed in an upper intermediate layer 600 over the first upper connective layer 500 subsequently, which will be discussed in detail below with reference to FIGS. 6A-6D. The conductive components in the first upper connective layer 500, including the supporting pad 504, the conductive channel 508, and/or the conductive line 510, may be electrically connected to conductive structures in layers and structures that will be formed over the upper intermediate layer subsequently, for example, a second upper connective layer, and a bump structure, which will be discussed in detail below with reference to FIGS. 7-10B. The supporting pad 504 may provide mechanical support for the bump structure that will be formed over the supporting pad 504. In one embodiment, the supporting pad 504, including the dielectric region 506 in the opening 512 and the portion of the conductive channel 508 passing through the supporting pad 504 considered together, has a conductive density of greater than approximately 50%.

The conductive components in the first upper connective layer 500, including the supporting pad 504, the conductive channel 508, and/or the conductive line 510, may include copper. Examples of other materials suitable for inclusion in the supporting pad 504 and conductive channel 508 include aluminum, aluminum/silicon/copper alloy, metal silicide (such as nickel silicide, cobalt silicide, tungsten silicide, tantalum silicide, titanium silicide, platinum silicide, erbium silicide, palladium silicide, or combinations thereof), copper, copper alloy, titanium, titanium nitride, tantalum, tantalum nitride, tungsten, polysilicon, and/or combinations thereof. The supporting pad 504, the conductive channel 508, and/or the conductive line 510 may include the same material, or may include different materials from each other.

The dielectric regions 502 and 506 may include silicon oxide, a material having a low dielectric constant such as a dielectric constant (k) less than about 2.5 (e.g., extra low k (ELK)), silicon nitride, silicon oxynitride, polyimide, spin-on glass (SOG), fluoride-doped silicate glass (FSG), undoped silica glass (USG), carbon doped silicon oxide (SiOC), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric regions 502 and 506 may include the same material or different materials.

The first upper connective layer 500 may be formed by patterning a dielectric layer deposited over the bottom PPI structure 400 using conventional photolithography techniques including forming photoresist layers, bake processes, exposure processes, development processes and/or other suitable processing.

Alternatively, the first upper connective layer 500 may be formed by forming one solid conductive layer over the bottom PPI structure 400. The solid conductive layer may be etched or patterned using one or more patterning processes (e.g., photolithography processes) to form conductive components including the supporting pad 504, the conductive channel 508, and/or the conductive line 510. A dielectric material may then be deposited onto the patterned conductive layer. The dielectric layer may then be etched-back and/or processed using CMP forming, for example, the dielectric regions 502 and 506.

Figure 6A:
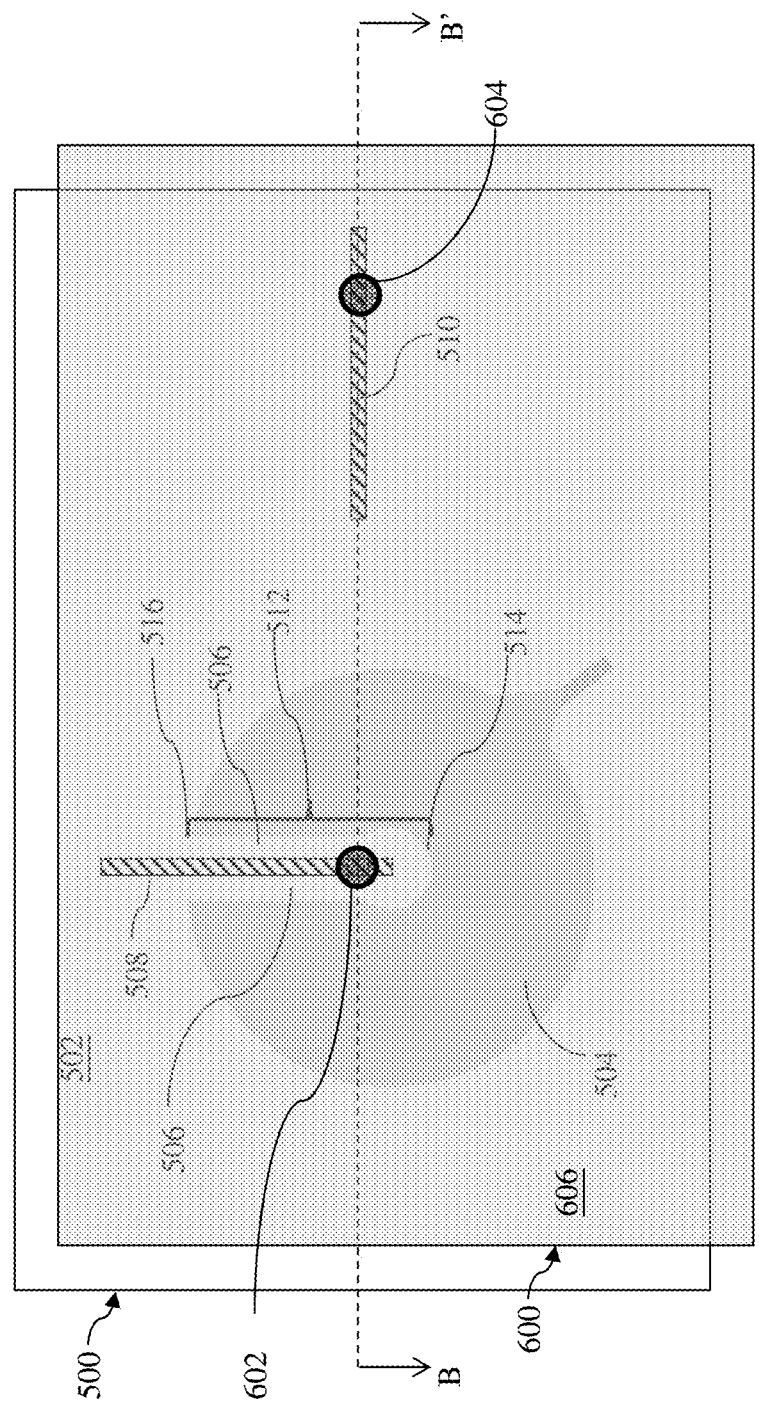
FIGS. 6A and 6C are top views of a portion of a semiconductor device after forming an upper intermediate layer of an upper PPI structure according to some embodiments.
Figure 6B:
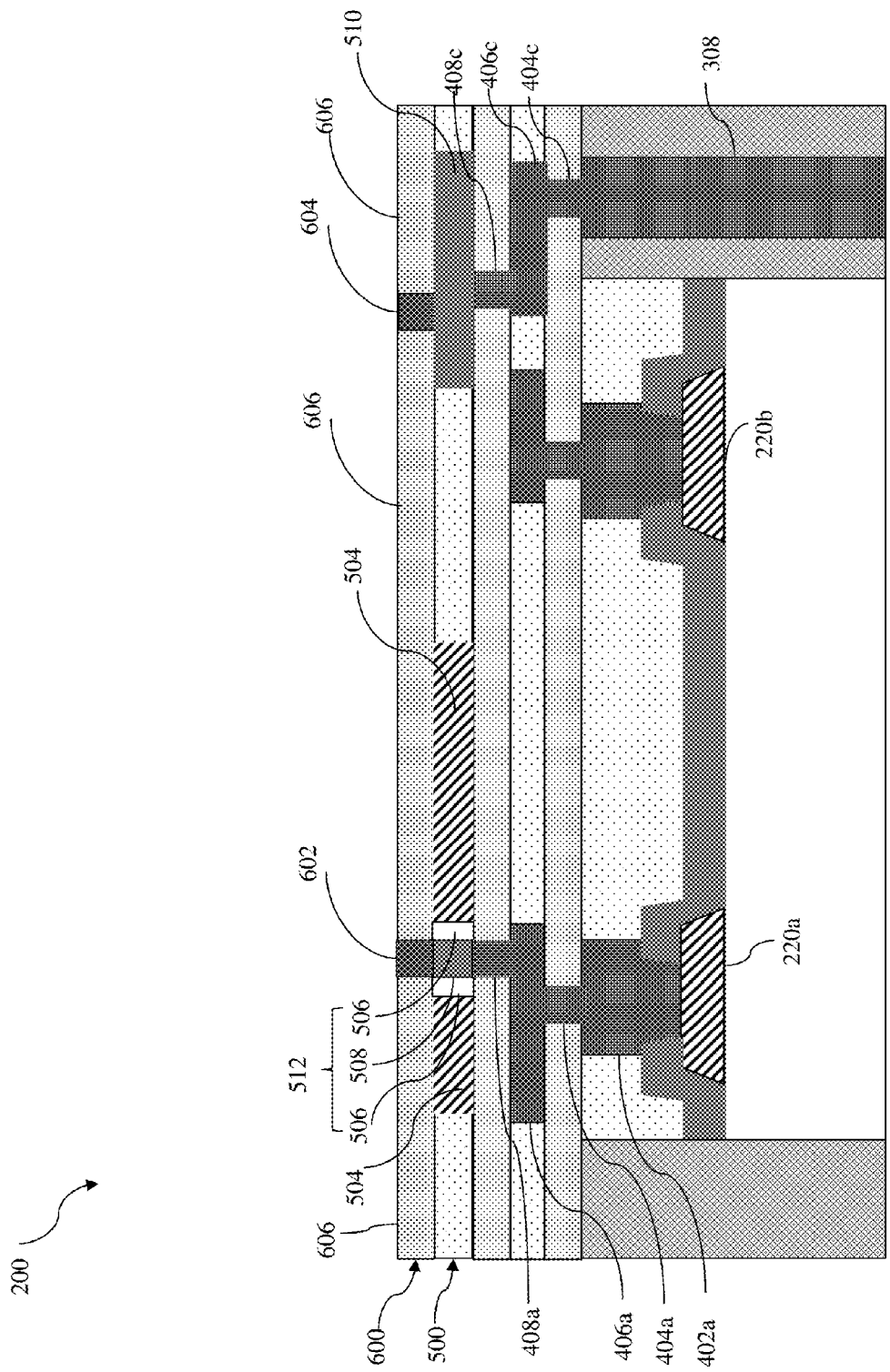
FIGS. 6B and 6D cross-sectional views of a portion of a semiconductor device along line B-B' of FIG. 6A and along C-C' of FIG. 6C respectively according to some embodiments.
Figure 6C:
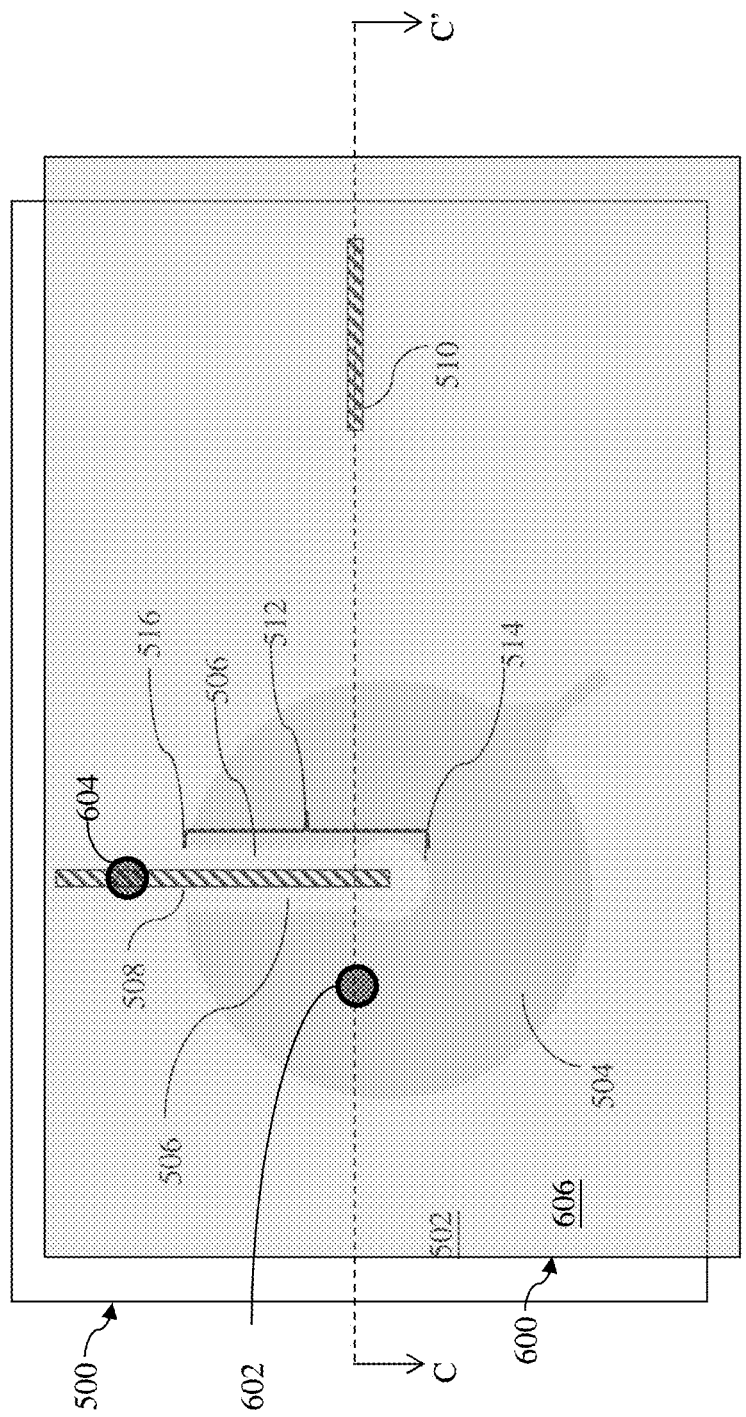
Figure 6D:
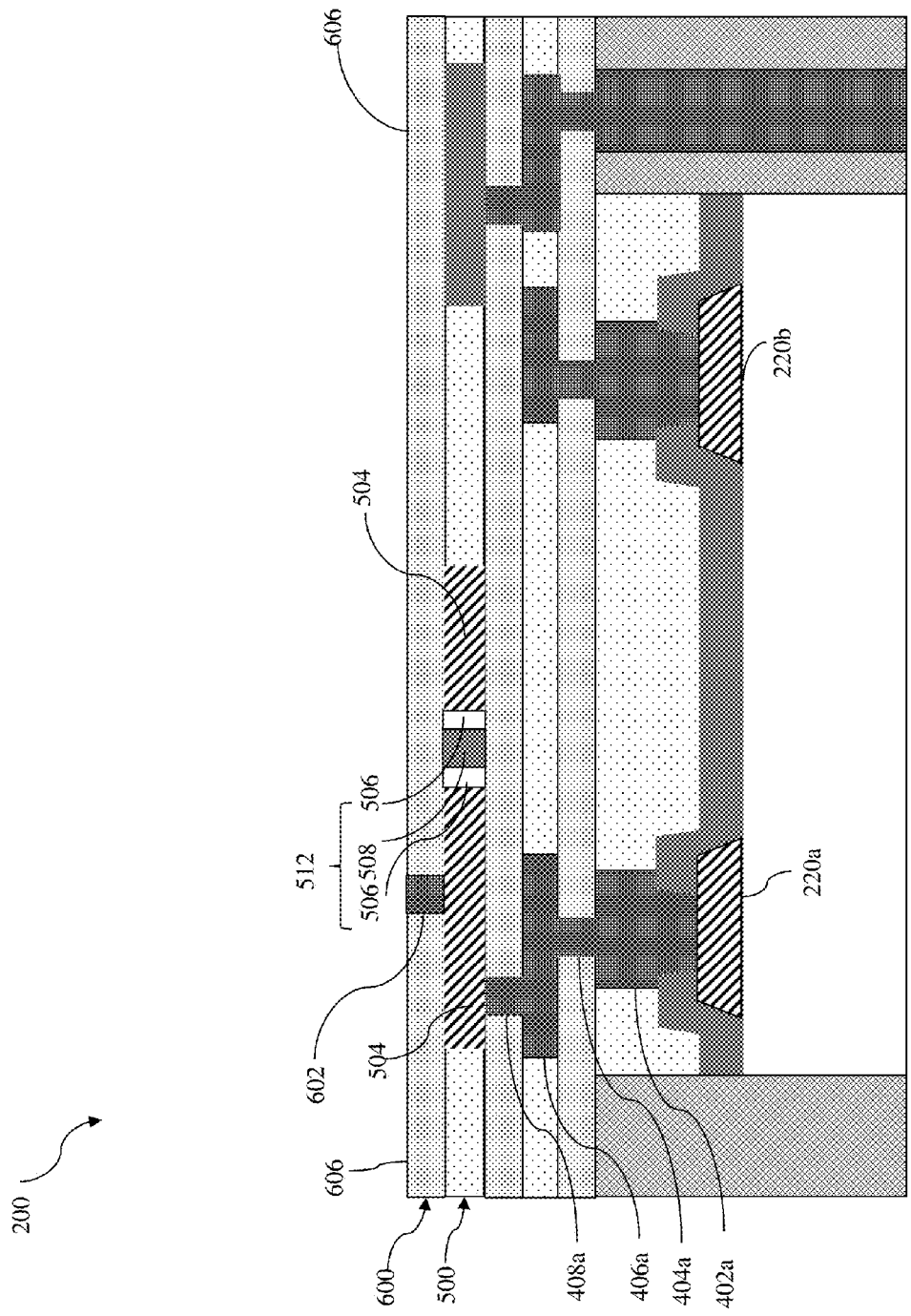

The method 100 proceeds to block 110, where an upper intermediate layer (also referred to as an upper intermediate RDL layer) of the upper PPI structure is formed over the first upper connective layer 500. Referring to the examples of FIGS. 6A-6D, illustrated is the device 200, where an upper intermediate layer 600 is formed over the first upper connective layer 500. The upper intermediate layer 600 includes conductive contacts/vias 602 and 604 in a dielectric 606. FIG. 6A and FIG. 6C are top views of a portion of the upper intermediate layer 600 and the first upper connective layer 500 of two embodiments respectively. FIG. 6B is a cross-sectional view of a portion of a first embodiment of the device 200 along the line B-B' of FIG. 6A, and FIG. 6D is a cross-sectional view of a portion of a second embedment of the device 200 along the line C-C' of FIG. 6C.

The conductive contacts/vias 602 and 604 may connect to various components in the first upper connective layer 500 discussed above with reference to block 104, including the supporting pad 504, the conductive channel 508 and the conductive line 510. Referring now to FIGS. 6A and 6B, in one embodiment, the bottom surface of the conductive contact/via 602 is in direct physical contact with the conductive channel 508 in an area inside the opening 512. As illustrated in FIG. 6B, the conductive contact/via 602 is electrically connected to the conductive pad 220a through conductive channel 508 in the first upper connective layer 500 and the bottom PPI structure 400 including using the conductive contacts/vias 408a and 404a, the conductive line 406a, and the conductive region 402a. Also illustrated in FIG. 6B is that the bottom surface of the conductive contact/via 604 is in direct physical contact with and electrically connected to the conductive line 510. The conductive contact/via 604 is electrically connected to the TSV structure 308 through the conductive line 510 in the first upper connective layer 500 and the conductive contacts/vias 408c and 404c, and the conductive line 406c in the bottom PPI structure 400.

Referring now to FIGS. 6C and 6D, in alternative embodiments, the bottom surface of the conductive contact/via 602 is in direct physical contact with and electrically connected to the supporting pad 504. As illustrated in FIGS. 6C and 6D, the conductive contact/via 602 is electrically connected to the conductive pad 220a through the supporting pad 504 in the first upper connective layer 500 and the bottom PPI structure 400 including using the conductive contacts/vias 408a and 404a, the conductive line 406a, and the conductive region 402a in the bottom PPI structure 400. As illustrated in FIG. 6C in some embodiments, the bottom surface of the conductive contact/via 604 is in direct physical contact with and electrically connected to the conductive channel 508 in an area that is not inside the opening 512.

It is noted that the configurations and connections illustrated in FIGS. 6A-6D are exemplary only and not intended to be limiting beyond what is specifically recited in the claims that follow. It will be understood by those skilled in the art that other configurations of the conductive contacts/vias in the upper intermediate layer 600 and the supporting pad, conductive channels, and conductive lines in the first upper connective layer 500 may be used. In some embodiments, the configurations are chosen for a given device design or process technology, or other process conditions. In some embodiments, the configurations are chosen based on circuit routing and/or signal integrity requirements. In an embodiment, the conductive channel 508 is connected by a contiguous conductive path (a conductive line or via) to one of the semiconductor devices 204 in the substrate 202 (e.g., using the conductive pad 220a), and the supporting pad 504 is connected by another contiguous conductive path (a conductive line or via) to another of the semiconductor devices 204 in the substrate 202 (e.g., using conductive pad 220b).

The conductive contacts/vias in the upper intermediate layer 600 may be in direct contact with and/or electrically connected to conductive structures in layers and structures that will be formed over the upper intermediate layer 600 subsequently, for example, a second upper connective layer, and a bump structure, which will be discussed in detail below with reference to FIGS. 7-10B.

The conductive contacts/vias 602 and 604 may include copper. Materials suitable for inclusion in the conductive contacts/vias are substantially similar to the materials suitable for use in the supporting pad 504, the conductive channel 508, and the conductive line 510 as discussed above with reference to FIGS. 5A-5B.

The dielectric regions 606 may include silicon oxide, low-k dielectric material, other suitable dielectric materials, or combinations thereof. Materials suitable for inclusion in the dielectric regions 606 are substantially similar to the materials suitable for use in dielectric regions 502 and 506 as discussed above with reference to FIGS. 5A-5B.

The upper intermediate layer 600 may be formed by patterning a dielectric layer deposited over the first upper connective layer 500 using conventional photolithography techniques including forming photoresist layers, bake processes, exposure processes, development processes and/or other suitable processing.

The method 100 proceeds to block 112, where a second upper connective layer (also referred to as a second upper RDL layer) is formed over the upper intermediate layer. Referring now to FIGS. 7A-D, various embodiments of a device 200 are illustrated, where a second upper connective layer 700 of the upper PPI structure 708 is formed over the upper intermediate layer 600. As illustrated in the example of FIGS. 7A-D, the second upper connective layer 700 includes a landing pad 702, a conductive line 704, and dielectric regions 706.

Figure 7A:
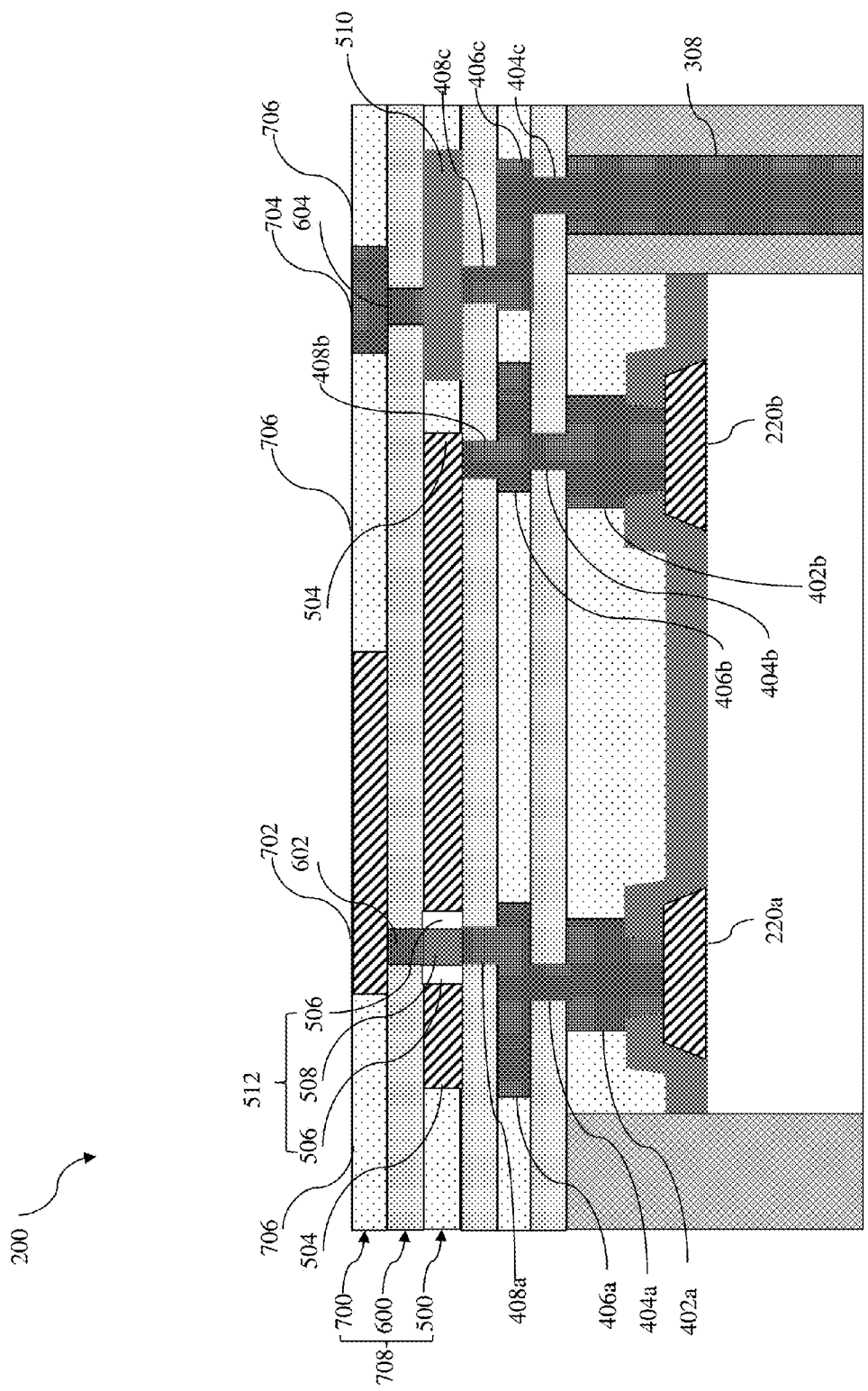
FIGS. 7A-D are cross-sectional views of a portion of a semiconductor device after forming a second upper connective layer of an upper PPI structure according to some embodiments.

As illustrated in FIG. 7A, in an embodiment, a bottom surface of the landing pad 702 is in direct physical contact with the conductive contact/via 602. The landing pad 702 is electrically connected to the conductive pad 220a through the conductive contact/via 602, the conductive channel 508, and the bottom PPI structure including the conductive contact/via 408a and 404a, the conductive line 406a, and the conductive region 402a. Also illustrated in FIG. 7A is that a bottom surface of the conductive line 704 is in direct physical contact with the conductive contact/via 604. The conductive line 704 is electrically connected to the TSV structure 308 through the conductive contact/via 604, the conductive line 510, and the bottom PPI structure including the conductive contact/via 408c and 404c, and the conductive line 406c. As illustrated in FIG. 7A, a bottom surface of the supporting pad 504 is in direct physical contact with a top surface of a conductive contact/via 408b. The supporting pad 504 is electrically connected to the conductive pad 220b through the bottom PPI structure including the conductive contact/via 408b and 404b, the conductive line 406b, and the conductive region 402b.

Figure 7B:
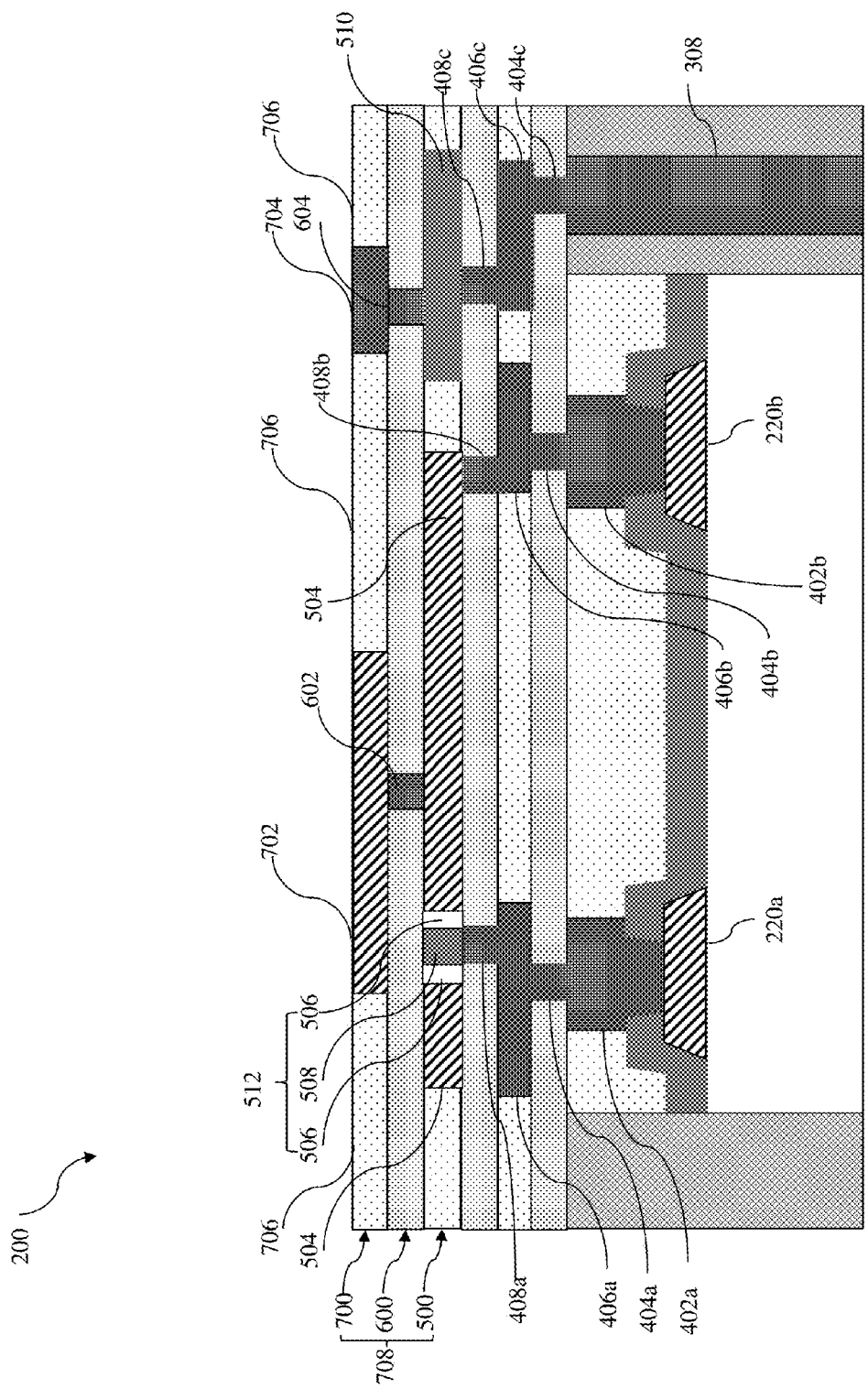

As illustrated in FIG. 7B, in an embodiment, a bottom surface of the landing pad 702 is in direct physical contact with the conductive contact/via 602, which in turn is in direct physical contact with the supporting pad 506. The landing pad 702 is electrically connected to the conductive pad 220b through the conductive contact/via 602, the supporting pad 504, and the bottom PPI structure including the conductive contact/via 408b and 404b, the conductive line 406b, and the conductive region 402b. Also illustrated in FIG. 7B is that a bottom surface of the conductive channel 508 physically contacts a top surface of the conductive contact/via 408a. The conductive channel 508 is electrically connected to the conductive pad 220a through the bottom PPI structure including the conductive contact/via 408a and 404a, the conductive line 406a, and the conductive region 402a.

Figure 7C:
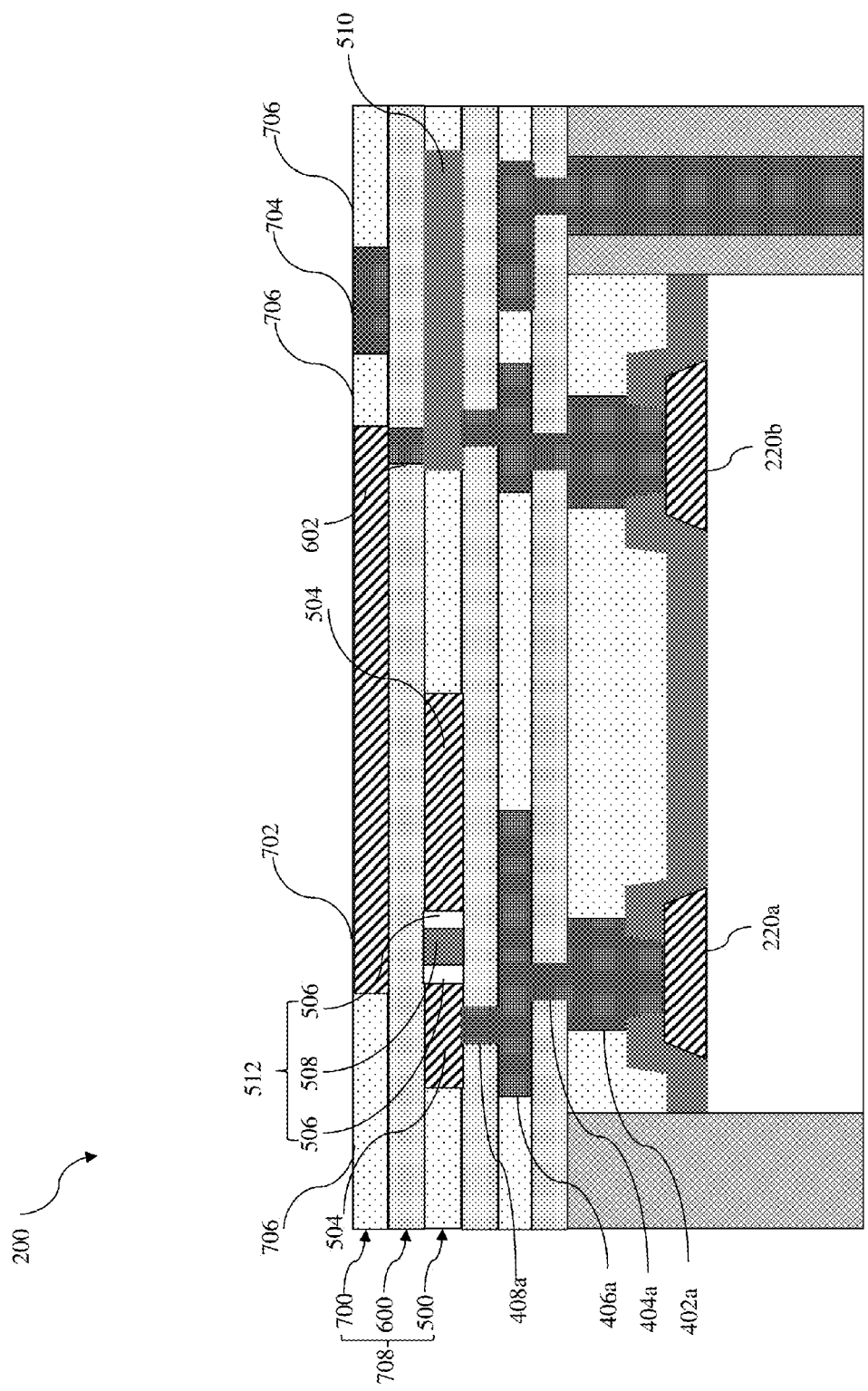

As illustrated in FIG. 7C, in an embodiment, a bottom surface of the landing pad 702 is in direct physical contact with a conductive contact/via 602, which in turn is in direct physical contact with the conductive line 510. The landing pad 702 is electrically connected to the conductive pad 220b through the conductive contact/via 602, the landing pad 702, and the components in the bottom PPI structure 400. Also illustrated in FIG. 7C is that similar to the embodiment illustrated in FIG. 6D, the supporting pad 504 is electrically connected to the conductive pad 220a through the bottom PPI structure 400 including the conductive contact/via 408a and 404a, the conductive line 406a, and the conductive region 402a.

Figure 7D:
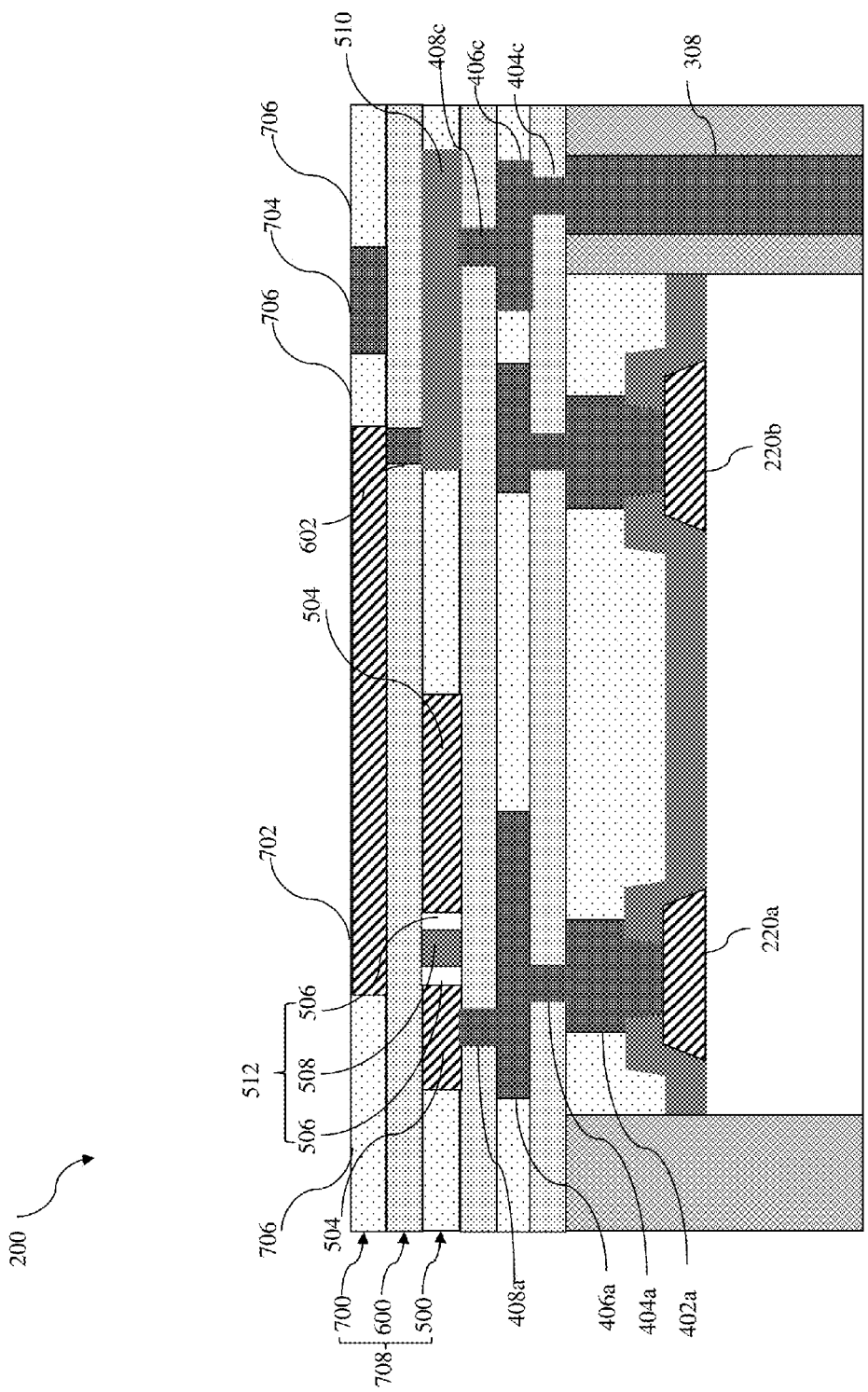

As illustrated in FIG. 7D, in an embodiment, a bottom surface of the landing pad 702 is in direct physical contact with a conductive contact/via 602, which in turn is in direct physical contact with the conductive line 510. The landing pad 702 is electrically connected to the TSV structures 308 through the conductive contact/via 602, the landing pad 702, and the components in the bottom PPI structure 400 including the conductive contact/via 408c and 404c, the conductive line 406c. Also illustrated in FIG. 7D is that similar to the embodiment illustrated in FIG. 6D, the supporting pad 504 is electrically connected to the conductive pad 220a through the bottom PPI structure 400 including the conductive contact/via 408a and 404a, the conductive line 406a, and the conductive region 402a.

Numerous other embodiments providing a connection between the landing pad 702 and the semiconductor devices 204 in the substrate 202 may be used. It is noted that the configurations and connections illustrated in FIGS. 7A-D are exemplary only and not intended to be limiting beyond what is specifically recited in the claims that follow. It will be understood by those skilled in the art that other configurations and connections may be desirable and chosen for a given device design or process technology, or other process conditions. In some embodiments, the configurations and connections are chosen based on circuit routing and/or signal integrity requirements. In an embodiment, the landing pad 702 is connected by a contiguous conductive path (a conductive line or via) to one of the supporting pad 504 and the conductive channel 508. In a further embodiment, the landing pad 702 is not connected by a contiguous conductive path to either the supporting pad 504 or the conductive channel 508. In yet another embodiment, the landing pad 702 is connected to both the supporting pad 504 and the conductive channel 508 by different contiguous conductive paths, e.g., different conductive lines and/or vias. In yet another embodiment, the landing pad 702 is connected by a contiguous conductive path to a conductive line 510. In yet another embodiment, the landing pad 702 is connected by a contiguous conductive path to a first component of the MLI structure 214. The supporting pad 504 may be connected by a contiguous conductive path to a second component of the MLI structure 214. The conductive channel 508 may be connected by a contiguous conductive path to a third component of the MLI structure 214. In yet another embodiment, the landing pad 702, the supporting pad 504, the conductive channel 508, and/or the conductive line 510 may be connected by different contiguous conductive paths to the same component of the MLI structure 214 or to different components of the MLI structure 214 respectively. In yet another embodiment, the landing pad 702 may be connected by a contiguous conductive path to a TSV structures providing through die connections in 3D packages, which is discussed in detail below with reference to FIG. 14.

As discussed in detail below with reference to FIGS. 9B-C, the sizes and locations of components (e.g., the landing pad 702 and the supporting pad 504) of the upper PPI structure 708 including the first upper connective layer 500, the upper intermediate layer 600, and the second upper connective layer 700 can be important for the strength of the upper PPI structure 708 and the distribution of the mechanical stress. In some embodiments, the center of the landing pad 702 and the center of the supporting pad 504 are substantially aligned vertically. In some embodiments, a top view of the landing pad 702 substantially overlaps a top view of the supporting pad 504. In some embodiments, the top view of the landing pad 702 has an area smaller than the area of the top view of the supporting pad 504. In one example, the top view of the landing pad 702 is completed enclosed by the top view of the supporting pad 504. In some embodiments, the supporting pad 504 has a width that is greater than a width of the landing pad 702. In one example, the different between the width of the supporting pad 504 and the width of the landing pad 702 is greater than about 40 µm.

The landing pad 702 and conductive line 704 may include copper. Materials suitable for inclusion in the landing pad 702 and conductive line 704 are substantially similar to the materials suitable for use in the supporting pad 502, the conductive channel 508, and the conductive line 510 as discussed above with reference to FIGS. 5A-B.

The dielectric regions 706 may include silicon oxide, low k dielectric material, other suitable dielectric materials, or combinations thereof. Materials suitable for inclusion in the dielectric regions 706 are substantially similar to the materials suitable for use in dielectric regions 502 and 506 as discussed above with reference to FIGS. 5A-B.

The second upper connective layer 700 may be formed by patterning a dielectric layer deposited over the upper intermediate layer 600 using conventional photolithography techniques including forming photoresist layers, bake processes, exposure processes, development processes and/or other suitable processing.

Alternatively, the second upper connective layer 700 may be formed by forming one solid conductive layer over the upper intermediate layer 600. The solid conductive layer may be etched or patterned using one or more patterning processes (e.g., photolithography processes) to form the landing pad 702 and the conductive line 704. A dielectric material may then be deposited onto the patterned conductive layer. The dielectric layer may then be etched-back and/or processed using CMP forming, for example, the dielectric regions 706.

Figure 8:
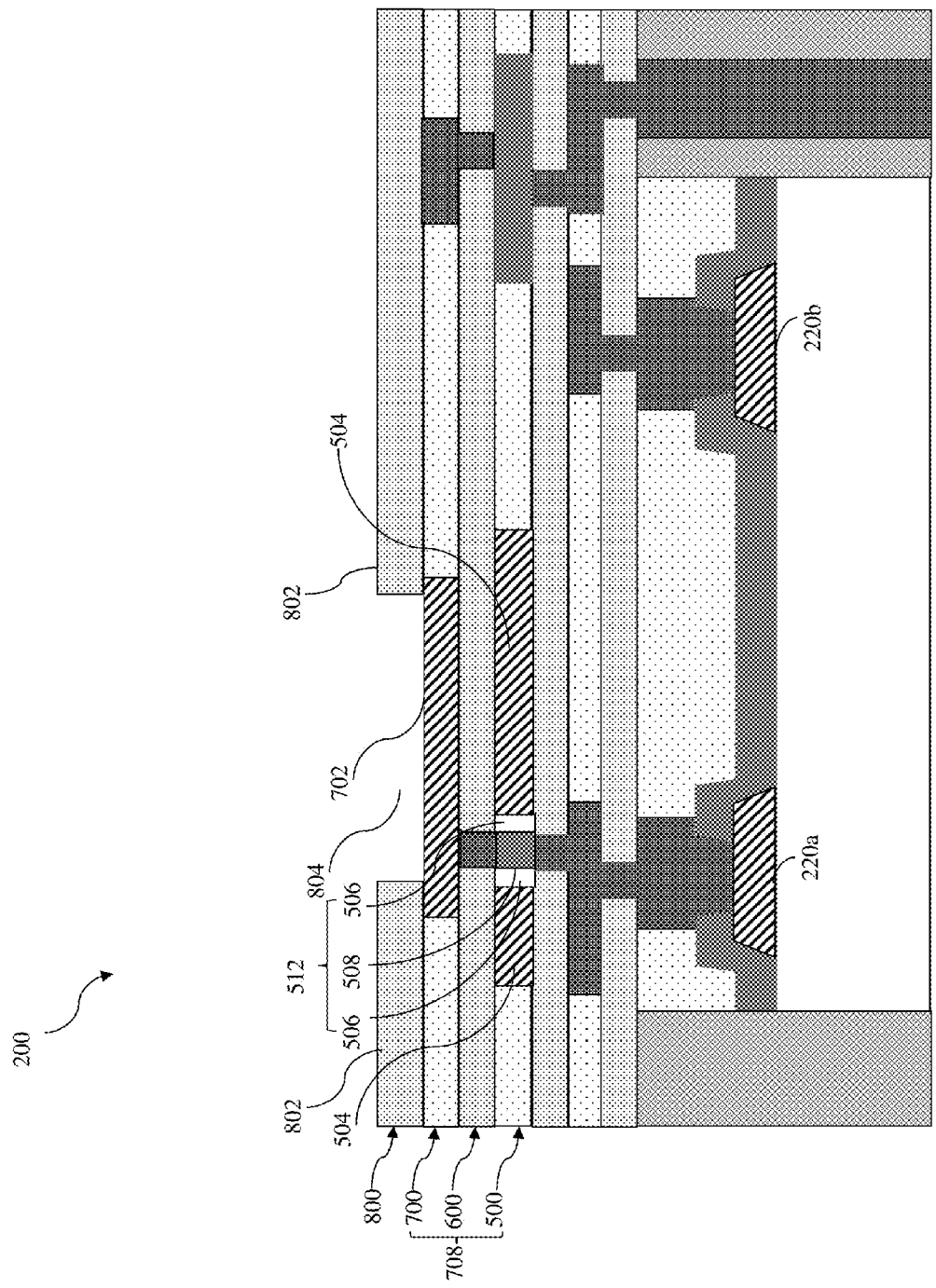
FIG. 8 is a cross-sectional view of a portion of a semiconductor device after forming a second protective layer according to some embodiments.

The method 100 proceeds to block 114, where a second protective layer is formed over the second upper connective layer. Referring now to the example of FIG. 8, illustrated therein is a device 200, where a second protective layer 800 is formed over the second upper connective layer 700. The second protective layer 800 may contain a plurality of layers to provide protection for the underlying materials. As illustrated in FIG. 8, the second protective layer 800 includes protective regions 802 and an opening 804.

In an embodiment, the second protective layer 800 has a thickness that is in a range between about 5 µm and about 30 µm. An opening 804 is formed in the portion of the second protective layer 800 overlying the landing pad 702. The opening 804 in the second protective layer 800 exposes at least a portion of the top surface of the landing pad 702. In an embodiment, a bump structure may be disposed over the second protective layer 800 and at least partially fill the opening 804 in the second protective layer 800, and a bottom surface of the bump structure may be in direct physical contact with the portion of the top surface of the landing pad 702, which will be described in detail with reference to FIGS. 9A-10B.

The protective regions 802 may include polymers of imide monomers. Materials suitable for inclusion in the protective regions 802 are substantially similar to the materials suitable for use in the first protective layer 302 as discussed above with reference to FIGS. 3A-B. The protective regions 802 may include the same material as the material of the first protective layer 302, or may include a different material from the material of the first protective layer 302. In some embodiments, the second protective layer 800 is formed using a spin-on coating method and/or a suitable deposition method. It is patterned and etched, for example, through a wet etching or a dry etching process, and exposes at least a portion of the landing pad 702 through the opening 804.

Figure 9A:
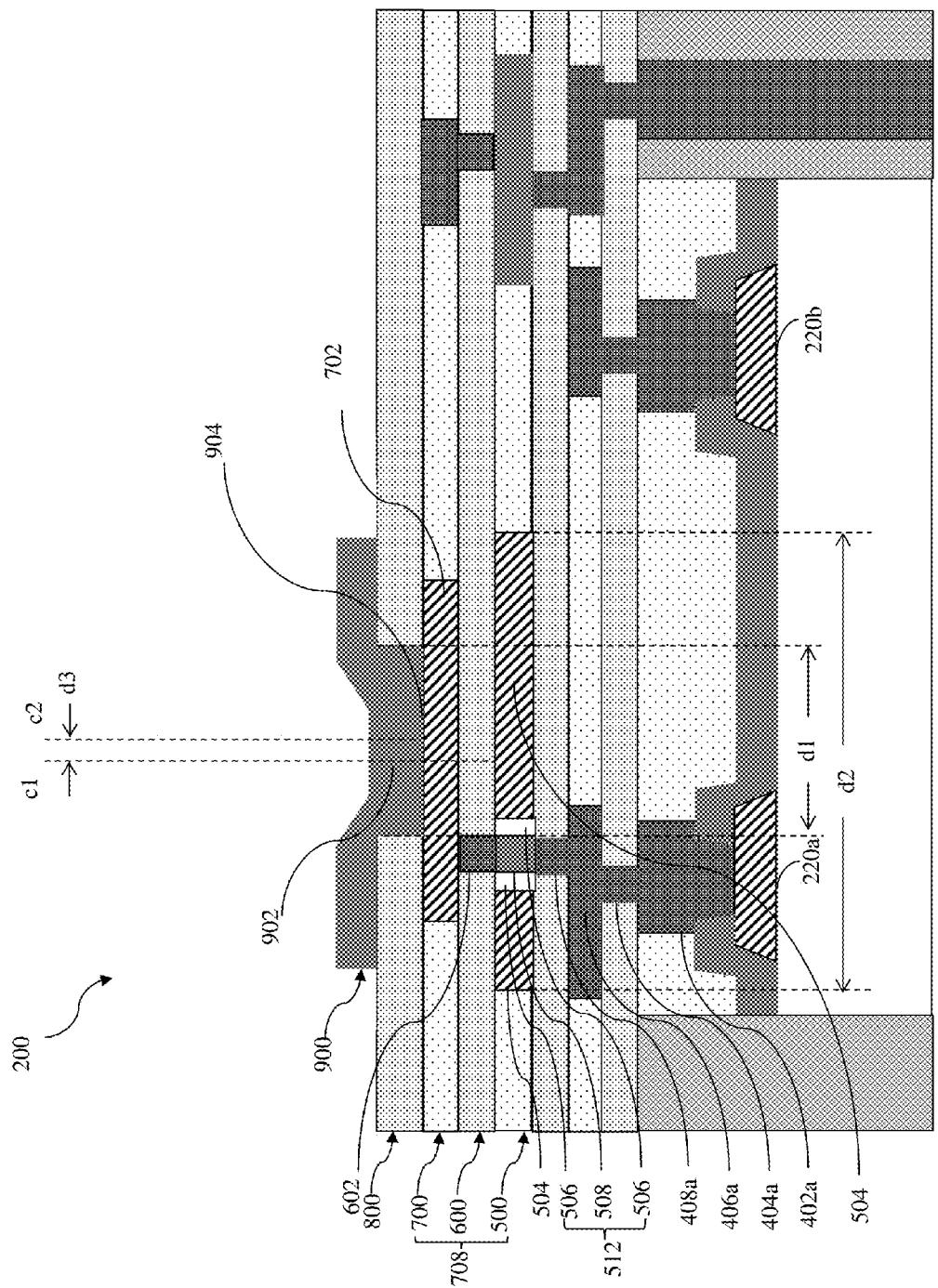
FIG. 9A is a cross-sectional view of a portion of a semiconductor device after forming an under-bump-metallization (UBM) layer according to some embodiments.

The method 100 proceeds to block 116, where a UBM layer is formed over the second protective layer. FIG. 9A illustrates a device 200, where a UBM layer 900 is formed over the second protective layer 800. The UBM layer 900 may be considered to be part of a bump structure. The UBM layer 900 includes a UBM component 902 that at least partially fills the opening 804 in the second protective layer 800. The UBM component 902 may be a metal pad on which a conductive bump (such as a solder ball or a solder bump) will be formed in a later process. As such, the UBM component 902 may be referred to as a UBM pad.

Referring to the example of FIG. 9A, the UBM pad 902 has a bottom surface 904 that directly contacts a top surface of the landing pad 702. The bottom surface is referred to as the UBM pad contact region 904. The UBM pad 902 is electrically connected to the conductive pad 22a through the landing pad 702, the conductive contact/via 602, the conductive channel 508, and the bottom PPI structure 400 including using the conductive contacts/vias 408a and 404a, the conductive line 406a, and the conductive region 402a.

Various stress sources (e.g., bonding, electrical test) may cause mechanical stress to a bump structure (including the UBM pad and conductive bump) and surrounding areas. The mechanical stress may cause damage to the bump structure as well as underlying layers. Examples of types of damage that may occur include cracking and delaying. The sizes and locations of the bump structure (including the UBM pad 902 and conductive bump) and components in the underlying layers (including the supporting pad) can be important for the strength of the upper PPI structure 708 including the first upper connective layer 500, the upper intermediate layer 600, and the second upper connective layer 700, and the distribution of the mechanical stress. Referring now to the examples of FIGS. 9B and 9C, the UBM pad contact region 904 has a center c1 and a width d1. The top surface of the supporting pad 504 has a center c2 and a width d2. Referring now to the example of FIG. 9B, a top view of the UBM pad contact region 904 in relation to the supporting pad 504 is provided. In one embodiment, c1 is substantially aligned with c2. For example, the distance d3 between c1 and c2 is smaller than 20% of d1. In some embodiments, the UBM pad contact region 904 has an area that is smaller than the supporting pad 504, and a top view of the UBM pad contact region 904 completely overlaps a top view of the supporting pad 504.

Figure 9C:
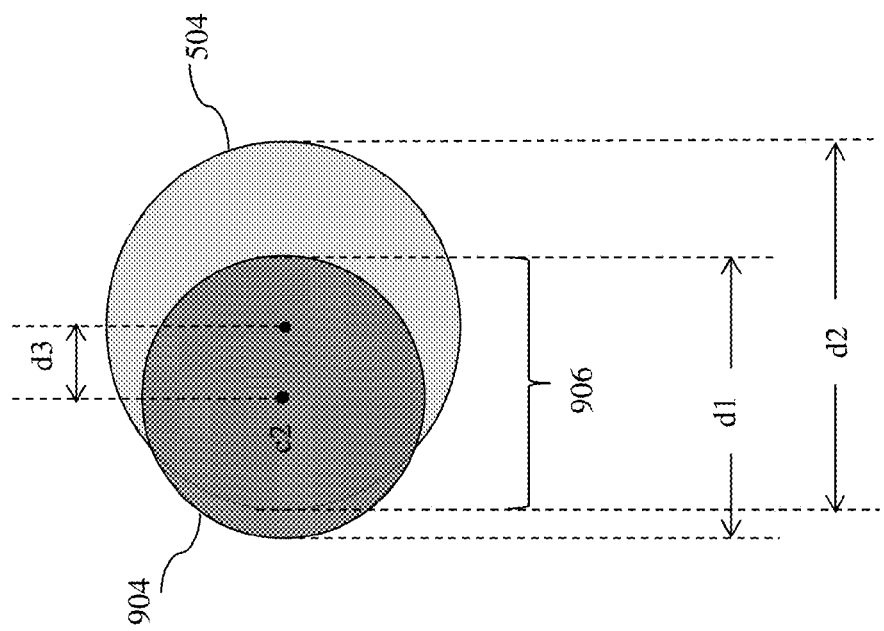
FIG. 9B-C are top views of a portion of a semiconductor device after forming a UBM layer according to some embodiments.

Referring now to the example of FIG. 9C, in some embodiments, the UBM pad contact region 904 has an area that is smaller than the supporting pad 504, and a top view of the UBM pad contact region 904 substantially overlaps the top view of the supporting pad 504. In some embodiments, the UBM pad contact region 904 has an overlapping area 906, where the top view of the overlapping area 906 completely overlaps the top view of the supporting pad 504. In an example, the top view of the overlapping area 906 has an area that is greater than 80% of the area of the top view of the UBM pad contact region 904. In a further example, c1 may not be substantially aligned with c2. In a further example, the distance d3 between c1 and c2 may be greater than 40% of d1.

Figure 9B:
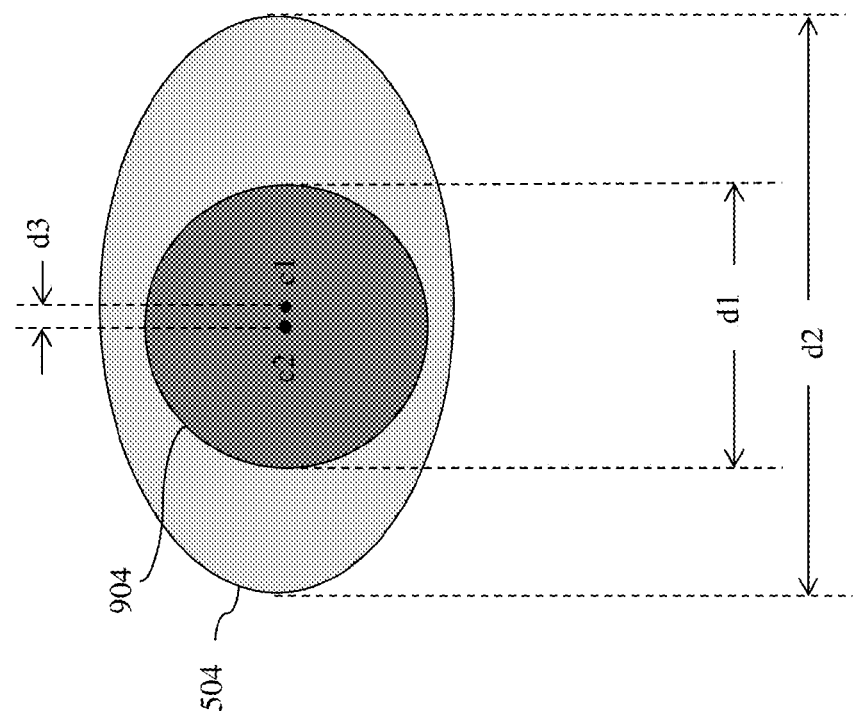

It is noted that the configurations, including the relative sizes and positions, of the UBM pad contact region 904 and the supporting pad 504 illustrated in FIGS. 9A-C are exemplary only and not intended to be limiting beyond what is specifically recited in the claims that follow. It will be understood by those skilled in the art that other configurations may be used. The UBM pad contact region 904 and the supporting pad 504 may have the same shape or have different shapes. Any shape may be used for either the UBM pad contact region 904 or the supporting pad 504. In some embodiments, the center c1 of the UBM pad contact region 904 is substantially aligned with the center c2 of the supporting pad 504. In a further embodiment, the distance d3 between c1 and c2 is smaller than 20% of the width d1 of the UBM pad contact region 904. In yet another embodiment, the UBM pad contact region 904 has an area that is smaller than the supporting pad 504. In yet another embodiment, a top view of the UBM pad contact region 904 completely overlaps a top view of the supporting pad 504. In yet another embodiment, over 80% of the area of the top view of the UBM pad contact region 904 overlaps the top view of the supporting pad 504.

The UBM layer 900 may contain a plurality of metal layers to provide adequate adhesion to the landing pad 702 therebelow and to provide protection for the underlying materials. In one embodiment, the UBM layer 900 may be formed by forming a titanium layer on the second protective layer 800 using a sputtering process, followed by forming a first copper layer on the titanium layer using a sputtering process, followed by forming a second copper layer on the first copper layer using a plating process. In an embodiment, the titanium layer has a thickness in a range from about 0.4 kilo-Angstroms (KÅ) to about 0.6 KÅ. In another embodiment, the first copper layer (e.g., formed by the sputtering process) has a thickness in a range from about 2 KÅ to about 4 KÅ. In yet another embodiment, the second copper layer (e.g., formed by the plating process) has a thickness in a range from about 2 microns (μm) to about 10 μm.

In another embodiment, the UBM layer 900 may be formed by forming a titanium layer on the second protective layer 800 using a sputtering process, followed by forming a first copper layer on the titanium layer using a sputtering process, followed by forming a second copper layer on the first copper layer using a plating process, followed by forming a nickel layer on the second copper layer using a plating process. In an embodiment, the titanium layer has a thickness in a range from about 0.4 KÅ to about 0.6 KÅ. In another embodiment, the first copper layer (e.g., formed by the sputtering process) has a thickness in a range from about 2 KÅ to about 4 KÅ. In yet another embodiment, the second copper layer (formed by the plating process) has a thickness in a range from about 1 μm to about 3 μm. In yet another embodiment, the nickel layer has a thickness in a range from about 0.2 μm to about 0.4 μm.

Figure 10A:
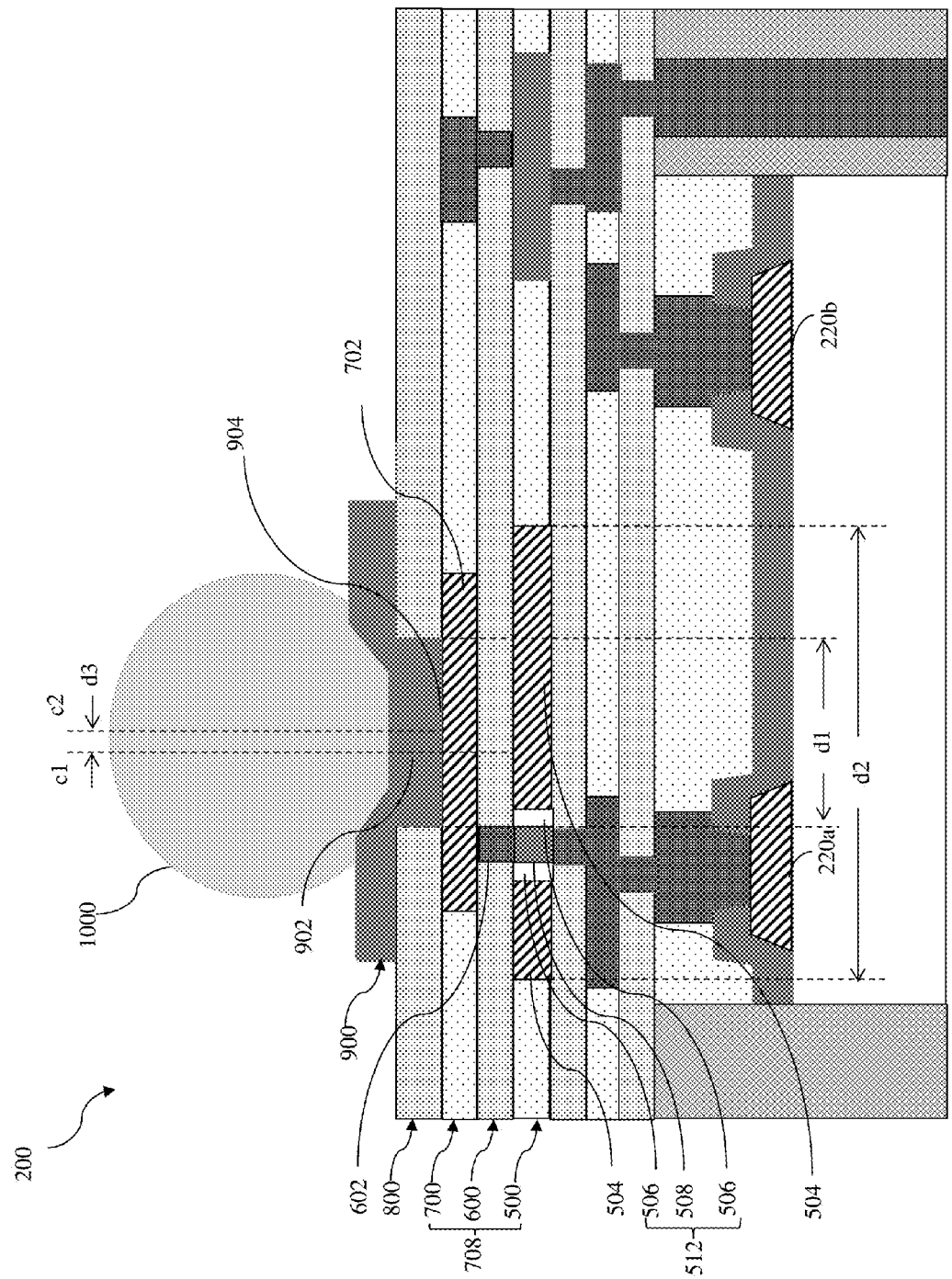
FIGS. 10A-B are cross-sectional views of a portion of a semiconductor device after depositing a conductive bump according to some embodiments.

The method 100 proceeds to block 118, where a conductive bump is disposed on the device. The conductive bump may provide an input/output (I/O) to the device. According to an embodiment of block 118, FIG. 10A shows the device 200 where a conductive bump 1000 is formed over and is connected (e.g., electrically) to the UBM pad 902. The conductive bump 1000 is part of the bump structure. In an embodiment, the conductive bump 1000 is directly formed on the UBM pad 902. As illustrated in FIG. 10A, the conductive bump 1000 is electrically connected to the conductive pad 220a, and allows external devices to be electrically coupled to (or gain electrical access to) the semiconductor devices 204. Hence, the conductive bump 1000 serves as a conductive terminal of the device 200.

The position of the conductive bump 1000 relative to the underlying layers can be important, for example, for the distribution of the mechanical stress for reasons substantially similar to those discussed above in detail with reference to FIGS. 9A-C. In an embodiment, the center of the conductive bump 1000 is substantially aligned with the center of the UBM pad contact region 904. In an embodiment, the center of the conductive bump 1000 is substantially aligned with the center of the supporting pad 504.

Figure 10B:
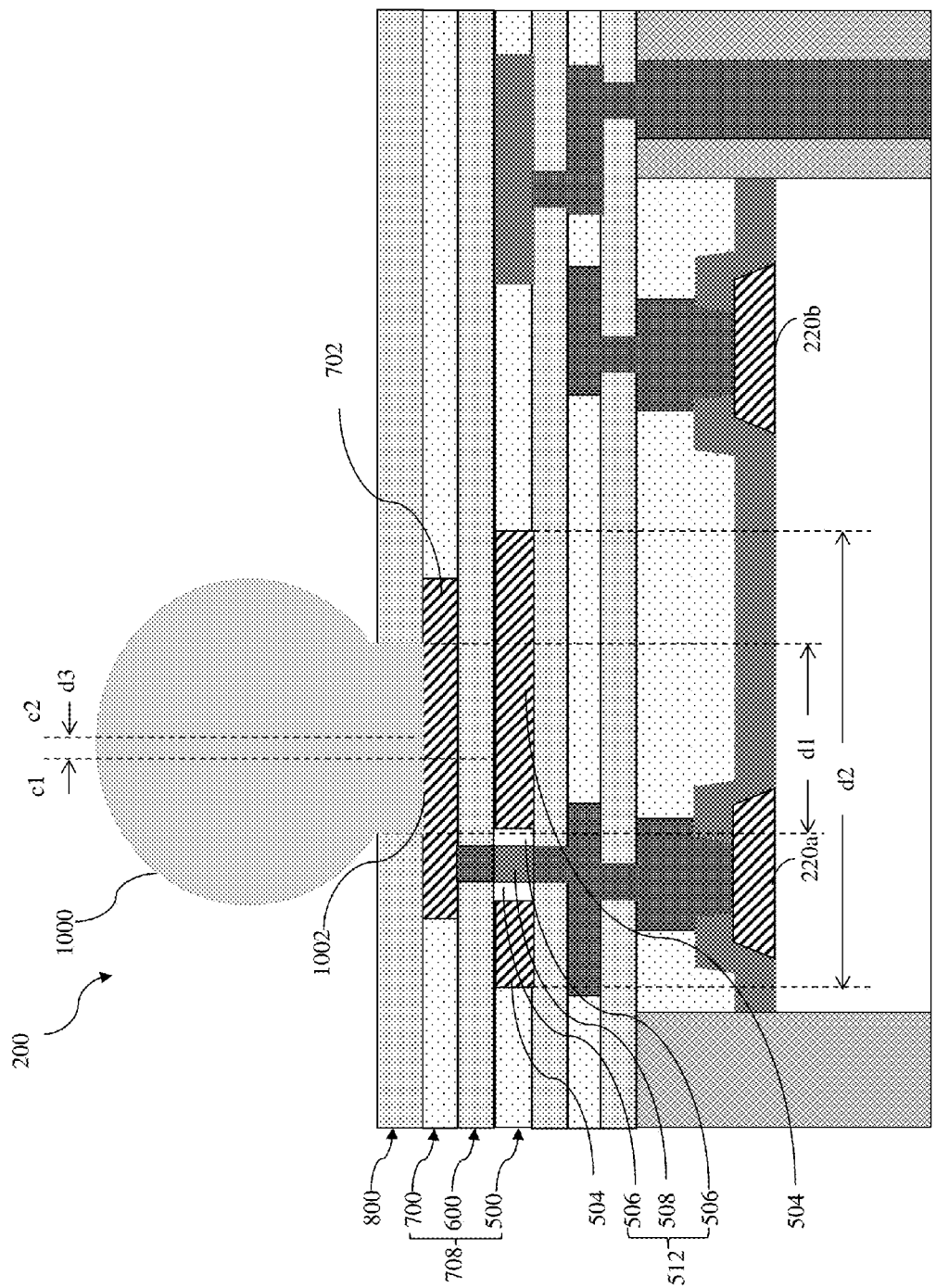

Referring to block 118 and to the example of FIG. 10B, in an embodiment, a UBM layer may not be formed over the landing pad 702. As shown in FIG. 10B, the conductive bump 1000 is formed over (and is thus electrically coupled to) the landing pad 702 and at least partially fills the opening 804 in the second protective layer 800. The conductive bump 1000 may be considered to be part of a bump structure. A bottom surface of the conductive bump 1000 physically contacts a top surface of the landing pad 702. The bottom surface of the conductive bump 1000 is referred to as a bump structure contact region 1002. In some embodiments, the sizes and locations of the bump structure contact region 1002 and the supporting pad 504 are substantially similar to the sizes and locations of the UBM pad contact region 904 and the supporting pad 504 discussed above with reference to FIGS. 9A-C.

In an embodiment, the conductive bump 1000 includes a solder ball or a solder bump, which may be formed in a ball mount process or a plating process. In an embodiment, the conductive bump 1000 includes metal materials, for example, lead (Pb). In an embodiment, the conductive bump 1000 includes a conductor pillar such as a copper pillar. In an embodiment, the conductive bump 1000 is a Ball Grid Array (BGA) ball.

It is noted that the configurations of the bump structure illustrated in FIGS. 10A-B are exemplary only and not intended to be limiting beyond what is specifically recited in the claims that follow. It will be understood by those skilled in the art that a plurality of bump structures may be formed over the substrate 202. In some embodiments, different bump structures are connected to different semiconductor devices 204 in the substrate 202 by different contiguous conductive paths respectively (e.g., using conductive pads 220*a* and 220*b* respectively).

The device 200 may undergo further processing known in the art. Moreover, additional process steps may be implemented before, during, and after the method 100, and some process steps described above may be replaced or eliminated in accordance with various embodiments of the method 100.

As discussed above, one feature of some embodiments described herein is that the conductive channels and supporting pad in the first upper connective layer 500 may perform circuit routing, and may be in direct physical contact with and/or electrically connected to various components in the other layers (e.g. the second upper connective layer, the upper intermediate layer, the bottom PPI structure, and/or the conductive pads) through different paths. Referring now to the examples of FIGS. 11A-E, some exemplary embodiments are described. FIGS. 11A-E are top views of conductive contacts/vias in the upper intermediate layer 600 and the components in the first upper connective layer 500. Referring to the example of FIG. 11A, in an embodiment, in the first upper connective layer 500, a first portion of a conductive channel 508 partially passes through a supporting pad 504 in an opening 512 in the supporting pad 504. The opening 512 has two opening branches 512*a* and 512*b*. The first portion of the conductive channel 508 includes a conductive channel branch 508*a* disposed in the opening branch 512*a* and a conductive channel branch 508*b* disposed in the opening branch 512*b*. A dielectric component 506 (including dielectric components 506*a* and 506*b*) interposes the first portion of the conductive channel 508 (including its conductive channel branches 508*a* and 508*b*) and the supporting pad 504. An upper intermediate layer 600 including conductive contacts/vias 602 and 604 is formed over the first upper connective layer 500. The conductive contacts/vias 602 and 604 are in direct contact with the conductive channel branches 508*a* and 508*b* respectively. The conductive contacts/vias 602 and 604 may be in direct physical contact with various components in the second upper connective layer 700. In an example, the conductive contacts/vias 602 and 604 are both in direct contact with the landing pad 702 in the second upper connective layer 700. In a further example, the conductive contacts/vias 602 and 604 are both in direct physical contact with the conductive line 704 in the second upper connective layer 700.

Figure 11A:
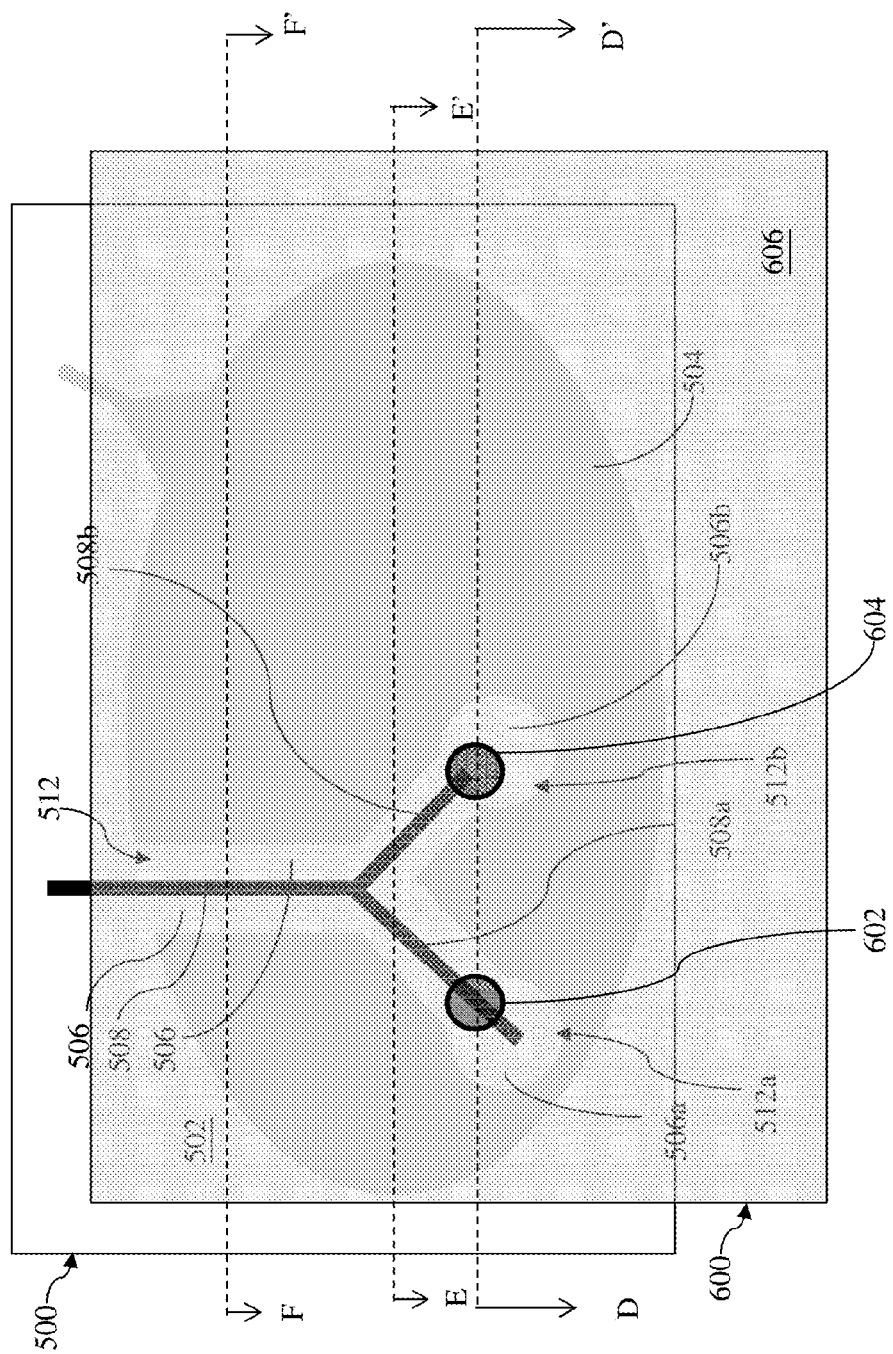
FIGS. 11A-E are top views of a portion of a semiconductor device according to some embodiments.
Figure 11C:
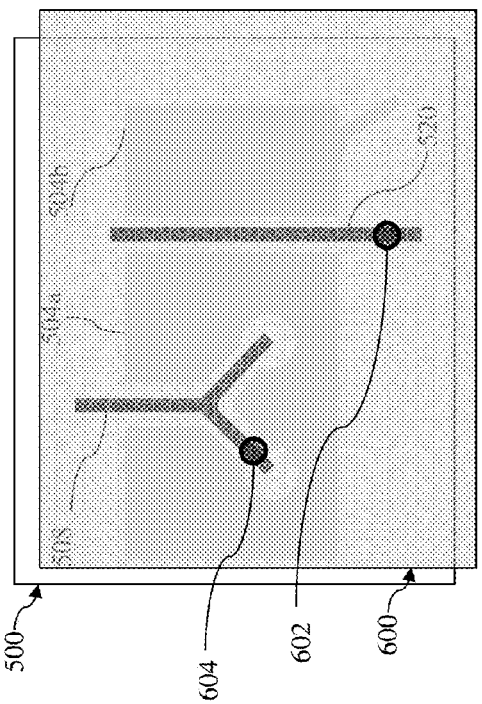
Figure 11E:
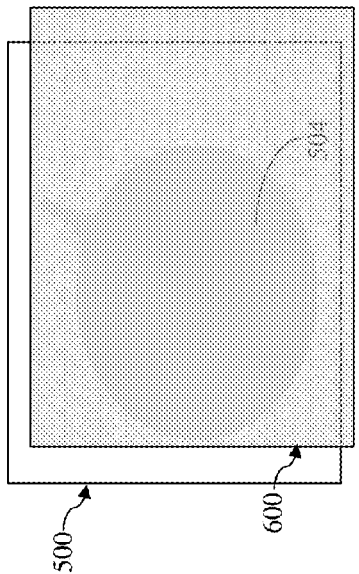
Figure 11B:
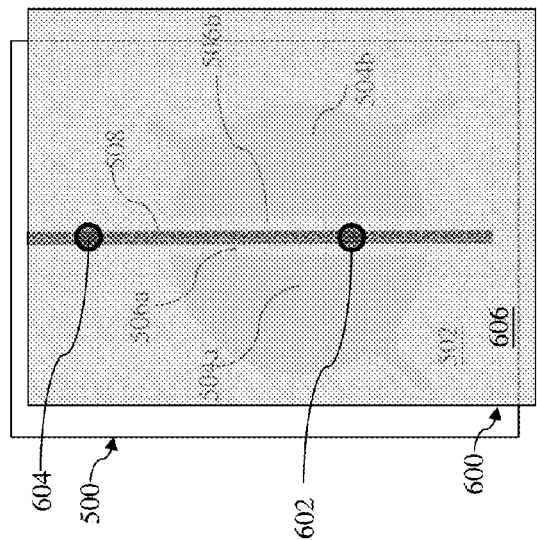

Referring to the example of FIG. 11B, in a first upper connective layer 500, a first portion of a conductive channel 508 passes entirely through a supporting pad 504 in an opening in the supporting pad 504. The supporting pad 504 includes a first supporting pad portion 504*a* and a second supporting pad portion 504*b*. A dielectric region 506*a* interposes the first portion of the conductive channel 508 and the first supporting pad portion 504*a*. A dielectric region 506*b* interposes the first portion of the conductive channel 508 and the second supporting pad portion 504*b*. The first supporting pad portion 504*a* and the second supporting pad portion 504*b* may be used for power supply wiring, dummy wiring, ground wiring, or signal wiring, and may have wiring functions that are different from each other, or may have wiring functions that are identical to each other. The first supporting pad portion 504*a* and the second supporting pad portion 504*b* may be electrically connected to different conductive pads. For example, the first supporting pad portion 504*a* may be electrically connected to the conductive pad 220*a* through the bottom PPI structure 400, and the second supporting pad portion 504*b* may be electrically connected to the conductive pad 220*b* through the bottom PPI structure 400. An upper intermediate layer 600 is formed over the first upper connective layer 500. The upper intermediate layer 600 includes conductive contacts/vias 602 and 604 connecting to the first portion of the conductive channel 508 and a portion of the conductive channel 508 that does not pass through the supporting pad 504 respectively. The conductive contacts/vias 602 and 604 may be in direct physical contact with various components in the second upper connective layer 700 similar to the conductive contacts/vias 602 and 604 discussed above with reference to FIG. 11A.

Referring to the example of FIG. 11C, in an embodiment, in an first upper connective layer 500, a first portion of a conductive channel 508 and a first portion of a conductive channel 520 pass at least partially through a supporting pad 504 respectively. An upper intermediate layer 600 is formed over the first upper connective layer 500. The upper intermediate layer 600 includes conductive contacts/vias 602 and 604 connecting to the first portion of the conductive channel 508 and a second portion of the conductive channel 520. The conductive contacts/vias 602 and 604 may be in direct physical contact with the landing pad 702 and the conductive line 704 in the second upper connective layer 700 respectively.

Figure 11D:
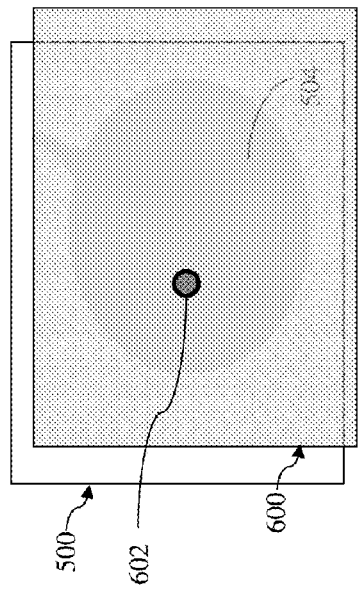

Referring now to the examples of FIGS. 11D and 11E, in some embodiments, a supporting pad 504 does not include any opening, and no conductive channels pass at least partially through the supporting pad 504. With reference to FIG. 11D, in an embodiment, an upper intermediate layer 600 includes a conductive contact/via 602 connecting to the supporting pad 504. The conductive contact/via 602 may be in direct physical contact with the landing pad 702 or the conductive line 704 in the second upper connective layer 700. With reference to the example of FIG. 11E, the upper intermediate layer 600 does not include any conductive contact/via that in direct physical contact with the supporting pad 504.

It is noted that the configurations and connections of the first upper connective layer 500 and the upper intermediate layer 600 illustrated in FIGS. 11A-E are exemplary only and not intended to be limiting beyond what is specifically recited in the claims that follow. It will be understood by those skilled in the art that other configurations and connections may be desirable and chosen for a given device design or process technology, or other process conditions. In some embodiments, the configurations and connections are chosen based on circuit routing and/or signal integrity requirements. In an embodiment, the opening 512 may include a plurality of opening branches, each opening branch including a conductive channel branch. In another embodiment, the supporting pad 504 may include multiple conductive channels including a conductive channel passes completely through the supporting pad 504. In yet another embodiment, the supporting pad 504 does not include any openings. In yet another embodiment, a conductive channel is connected to multiple conductive contacts/vias in the upper intermediate layer 600. In yet another embodiment, multiple conductive channels in the first upper connective layer 500 are connected to conductive contacts/vias in the upper intermediate layer 600 respectively. In yet another embodiment, the supporting pad 504 is not connected to any conductive contacts/vias in the upper intermediate layer 600. It is also understood that combinations of any number of the configurations and connections described above may be used.

Figure 12A:
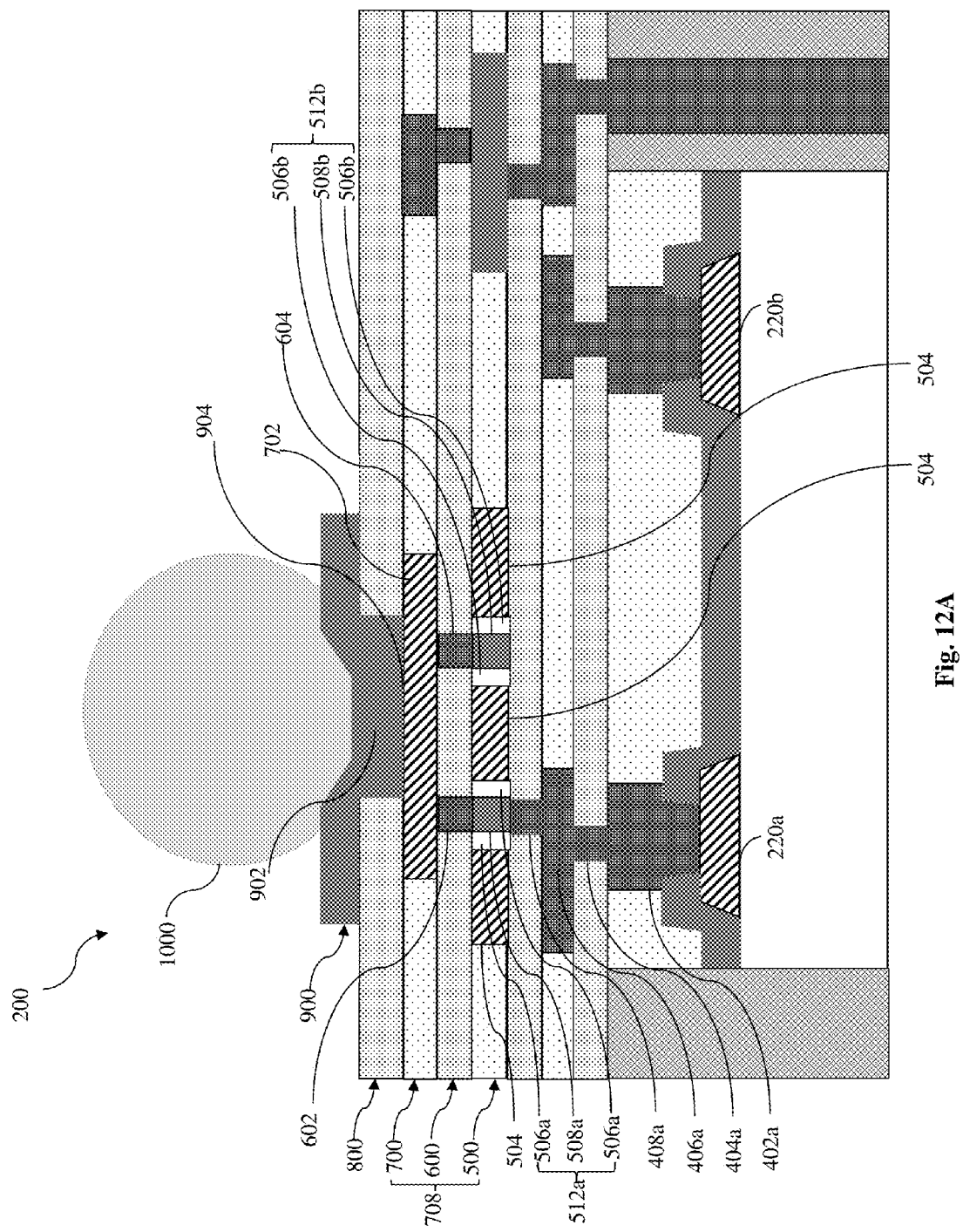
FIGS. 12A-C are cross-sectional views of a portion of the same semiconductor along lines D-D', E-E', and F-F' of FIG. 11A respectively according to some embodiments.
Figure 12B:
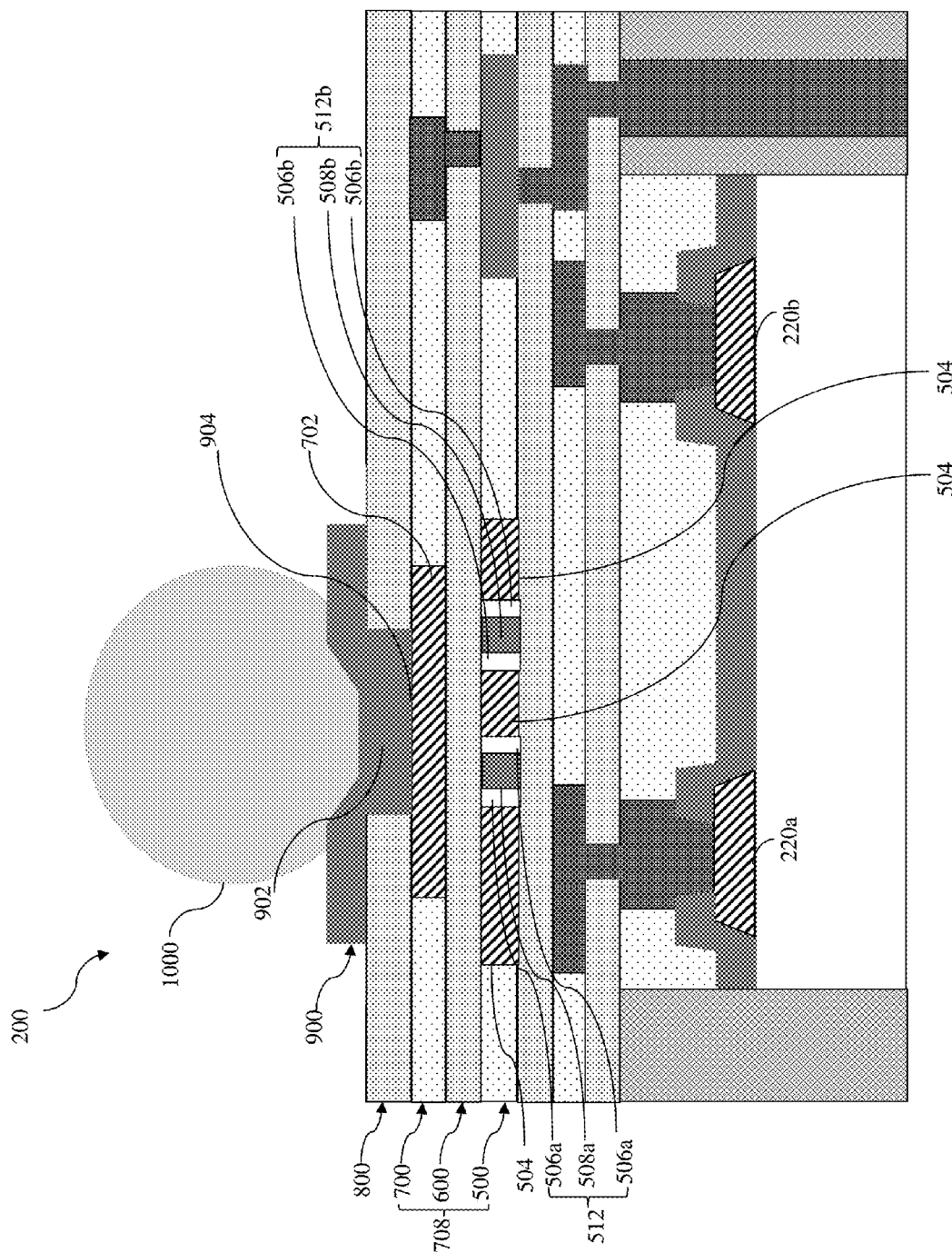
Figure 12C:
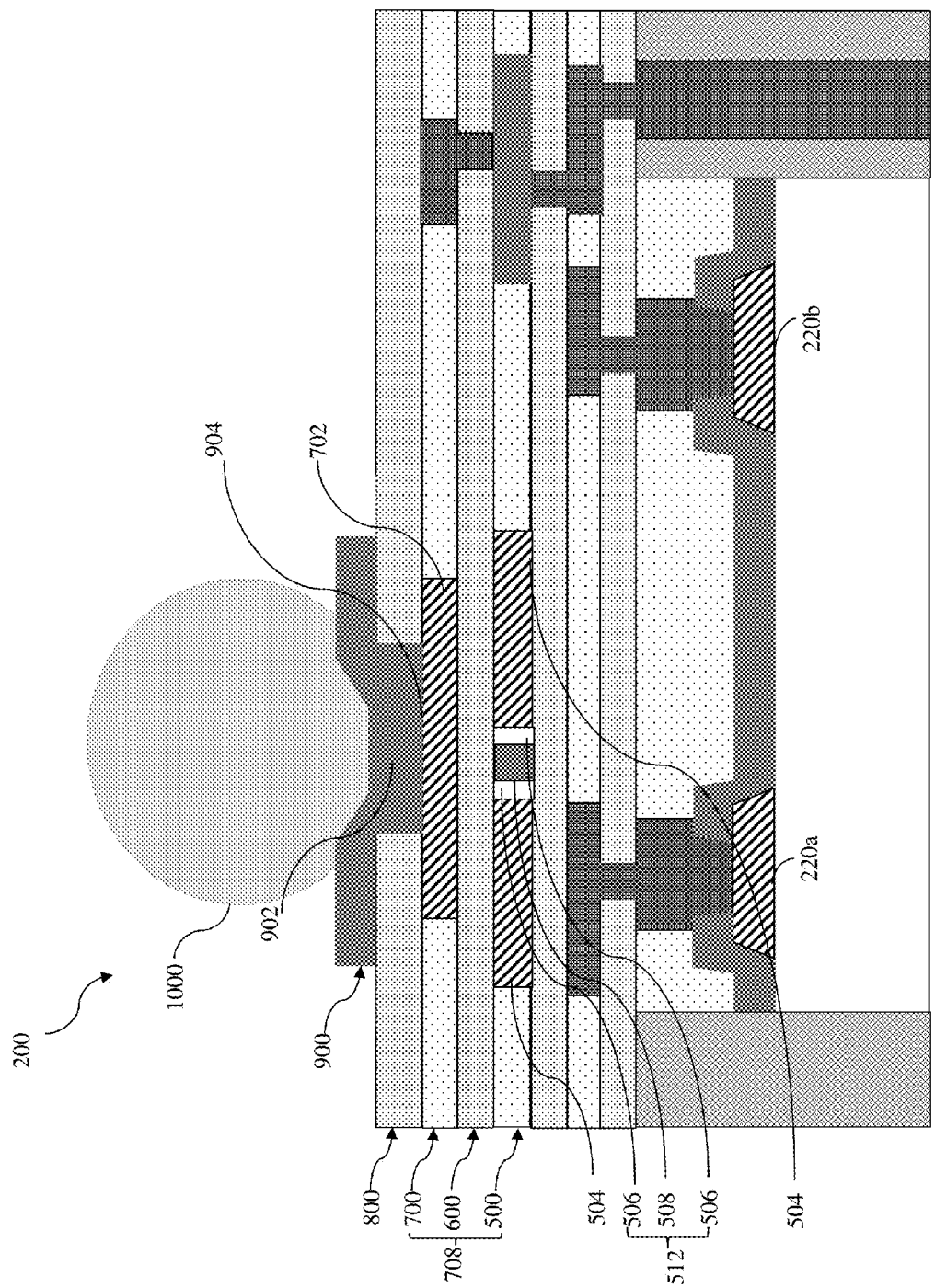
Figure 13:
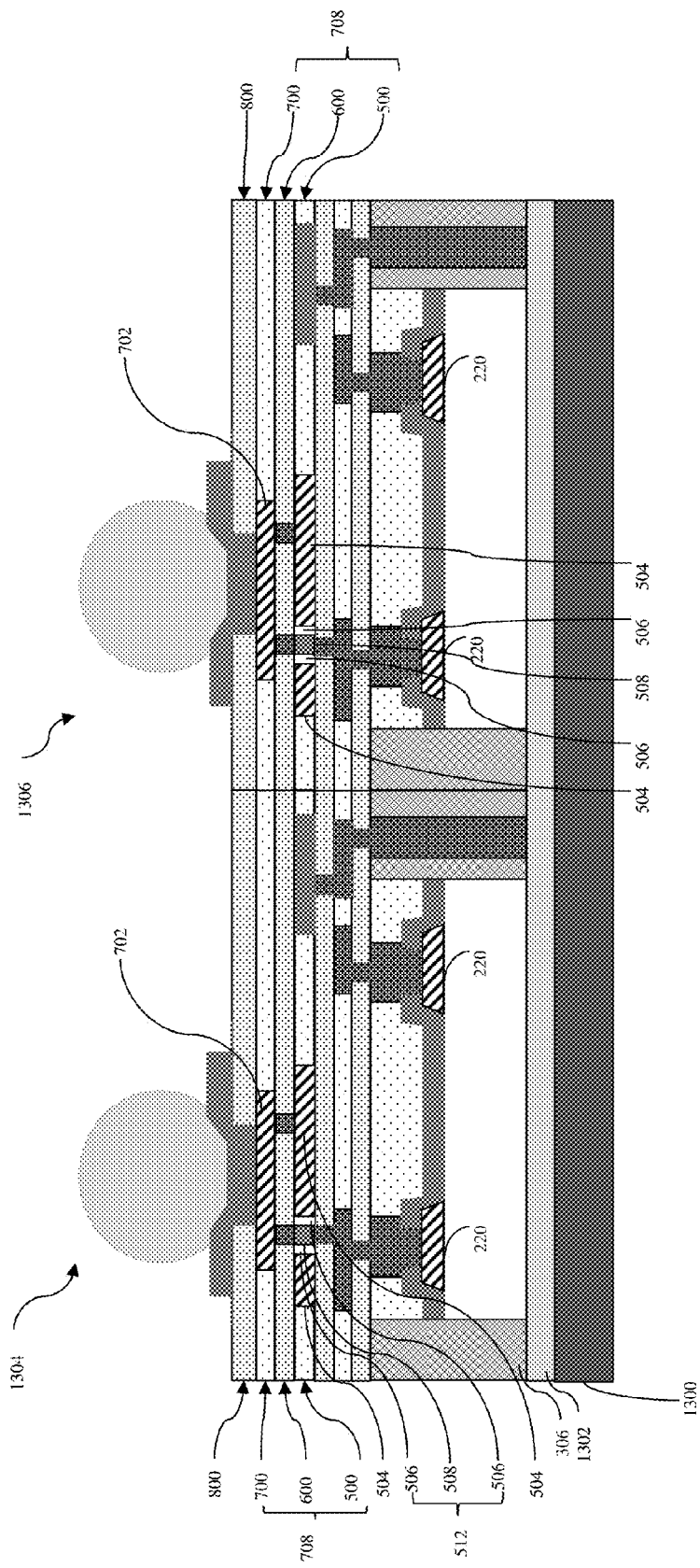
FIGS. 13 and 14 are cross-sectional view of a portion of a package according to some embodiments.

With reference to cross-sectional views of the same device 200 illustrated in FIG. 11A along different lines of FIG. 11A, some embodiments of the present disclosure are described. FIGS. 12A-C are cross-sectional views of the same device 200 along the lines D-D', E-E', and F-F' of FIG. 11A respectively. As shown in FIG. 12A, in the cross section along the line D-D' of FIG. 11A, the conductive contacts/vias 602 and 604 in an upper intermediate layer 600 are in direct physical contact with the conductive channel branches 508a and 508b respectively. The conductive contacts/vias 602 and 604 are both in direct physical contact with a landing pad 702. As shown in FIG. 12A, the conductive bump is electrically connected to the conductive pad 220a through the UBM pad 902, the landing pad 702, the conductive contact/via 602, the conductive channel branch 508a, and the bottom PPI structure 400 including using the conductive contacts/vias 408a and 404a, the conductive line 406a, and the conductive region 402a.

Referring now to the example of FIG. 12B, at the cross section along the line E-E' of FIG. 11A, no conductive contacts/vias in the upper intermediate layer 600 are in direct physical contact with the conductive channel branch 508a, the conductive channel branch 508b, or the landing pad 702. Referring now to FIG. 12C, at the cross section along the line F-F' of FIG. 11A, no conductive contacts/vias in the upper intermediate layer 600 are in direct physical contact with the conductive channel 508 or the landing pad 702.

It is noted that the connections provided herein with reference to FIGS. 12A-C are merely exemplary, and are not meant to be limiting in any way beyond what is specifically recited in the claims. It will be understood by those skilled in the art that different connections may be desirable and chosen for a given device design or process technology, or other process conditions. For example, the conductive channel branches 508a and 508b may be connected to different semiconductor devices 204 in the substrate 202 (e.g., using the conductive pads 220) respectively by different contiguous conductive paths other than illustrated in FIGS. 12A-C (e.g., using conductive lines/contacts/vias in the bottom PPI structure 400).

Some embodiments are used in multi-chip InFO packages. Referring now to the example of FIG. 13, in an embodiment, a carrier 1300 and a polymer base layer 1302 laminated on carrier 1300 are provided. The carrier 1300 may be a blank glass carrier, a blank ceramic carrier, or the like. The polymer base layer 1302 may be formed of Ajinomoto Buildup Film (ABF), polyimide, PolyBenzOxazole (PBO), BenzoCycloButene (BCB), Solder Resist (SR) film, Die-Attach Film (DAF), or the like, although other types of polymers may be used. Polymer base layer 1302 has a planar top surface. Devices 1304 and 1306 that are similar to the device 200 discussed above are placed over the polymer base layer 1302. Devices 1304 and 1306 may have structures that are different from each other, or may have structures that are identical to each other. A molding material 306 is molded on the devices 1304 and 1306, and fills the gap between the devices 1304 and 1306.

Figure 14:
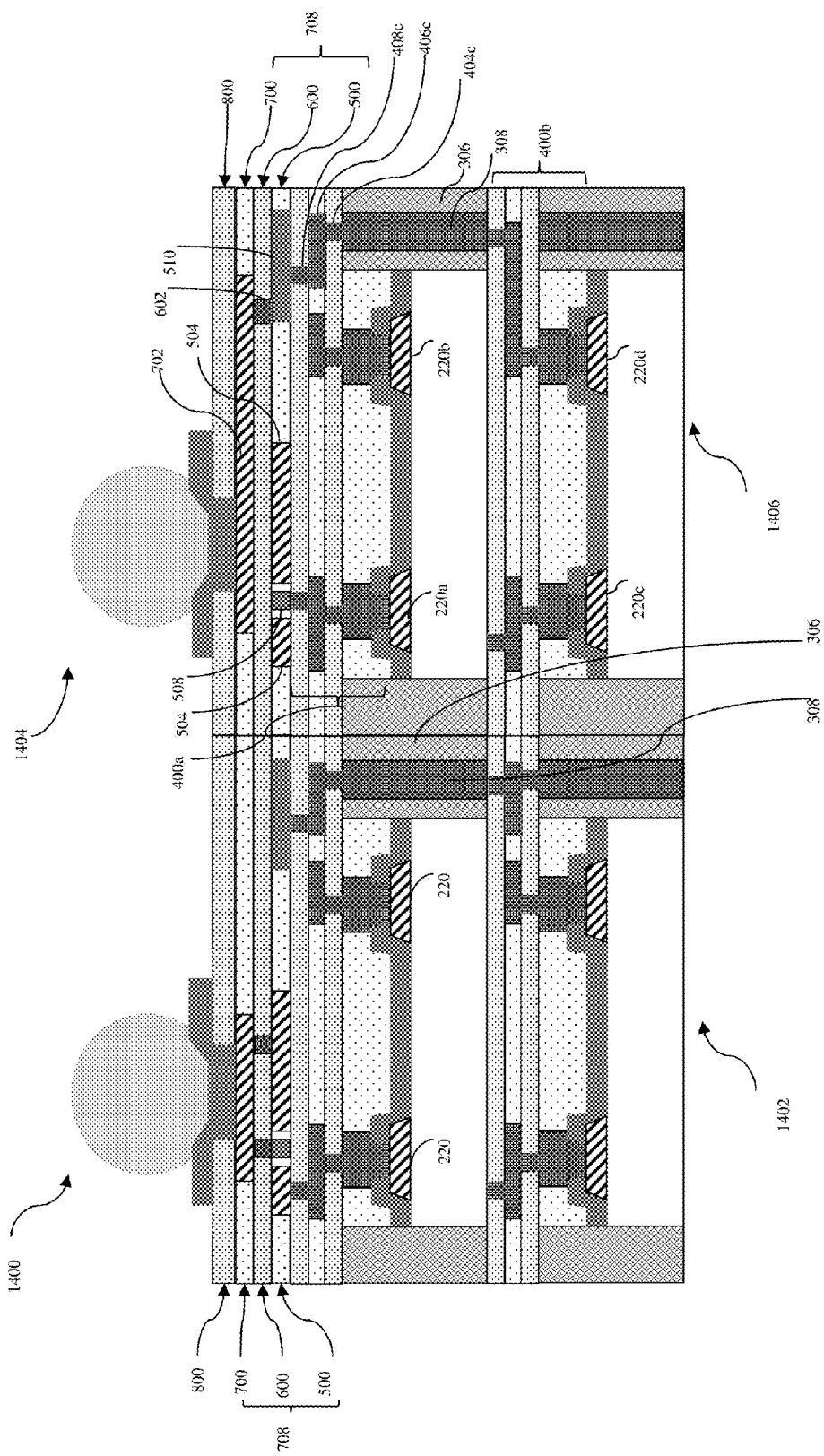

Some embodiments of the present disclosure are used in 3D packages. Referring now to FIG. 14, a device 1400, that is similar to the device 200 discussed above with reference to FIGS. 1-12C, is stacked on a device 1402, and a device 1404 that is similar to the device 200 discussed above with reference to FIGS. 1-12C, is stacked on a device 1406. The devices 1400, 1402, 1404, and 1406 include TSV structures 308 providing through-die connections in 3D packages. In one embodiment, as illustrated in FIG. 14, the device 1404 includes a landing pad 702 electrically connected to a first bonding pad 220d (and/or a first semiconductor device, e.g. a transistor or a diode) of the device 1406 by a contiguous conducting path using a conductive contact/via 602, a conductive line 510, the components in the bottom PPI structure 400a including the conductive contact/via 408c and 404c, and the conductive line 406c, the TSV structures 308 of the device 1404, and the bottom PPI structure 400b of the device 1406. In example of FIG. 14, neither the supporting pad 504 nor the conductive channel 508 of the device 1404 is electrically connected to the first bonding pad 220d (or the first semiconductor device) of the device 1406 by a contiguous conducting path using the TSV structures 308 of the device 1404. In the example of FIG. 14, the conductive channel 508 of the device 1404 is electrically connected to the second bonding pad 220a (and/or a second semiconductor device, e.g. a transistor or a diode) of the device 1404 by a contiguous conducting path using bottom PPI structure 400a of the device 1404, while neither the supporting pad 504 nor the landing pad 702 is electrically connected to the second bonding pad 220a (or the second semiconductor device) of the device 1404 by a contiguous conducting path. In a further embodiment, a supporting pad or a conductive channel in the first upper conductive layer 500 of the device 1404 may be electrically connected to a third bonding pad 220c (and/or a third semiconductor device, e.g. a transistor or a diode) of the device 1406 by a contiguous conducting path using the bottom PPI structure 400a and the TSV structure 308 of the device 1404, and the bottom PPI structure 400b of the device 1406, while the landing pad 702 of the device 1404 is not electrically connected to the third bonding pad 220c (or the third semiconductor device) of the device 1406 by a contiguous conducting path using the bottom PPI structure 400a and the TSV structure 308 of the device 1404 and the bottom PPI structure 400b of the device 1406.

The various embodiments of the present disclosure discussed above offer advantages over conventional PPI structures. No particular advantage is required for all embodiments, and that different embodiments may offer different advantages. One of the advantages in some embodiments is that a conductive channel may be formed in a supporting pad in a first upper connective layer, and both the supporting pad and the conductive channel may perform circuit routing. By doing this, some embodiments of the present disclosure offer more flexible circuit routing capabilities, higher design flexibility, and better signal integrity. Moreover, using some embodiments of the present disclosure, fewer PPI layers are needed, which lowers the cost and enlarges the process window.

Thus, the present disclosure provides in an embodiment a semiconductor device. The semiconductor device includes a die that contains a substrate and a bond pad. A connective layer is disposed over the die. The connective layer includes a supporting pad and a conductive channel. A portion of the conductive channel passes at least partially through the supporting pad. At least one dielectric region is interposed between the supporting pad and the portion of the conductive channel that passes at least partially through the supporting pad.

The present disclosure also provides in another embodiment a semiconductor device. The die includes a multilayer interconnect (MLI) structure. The MLI structure includes a first conductive component and a second conductive component. A connective layer is disposed over the die. The connective layer includes a supporting pad. The supporting pad is electrically connected to the first conductive component of the MU structure. The supporting pad has an opening extending from an edge of the supporting pad to a point within the supporting pad. The opening includes a continuous conductive planar path that is electrically connected to the second conductive component of the MLI structure. The opening further includes at least one dielectric component interposed between the continuous conductive planar path and the supporting pad.

An embodiment of a method of forming a semiconductor device is also provided. In the embodiment, the method includes providing a die that includes a substrate and a bonding pad over the first substrate. The method further includes forming a connective layer over the die, which includes depositing a dielectric layer of a dielectric material over the die and patterning the dielectric layer. The patterning the dielectric layer includes forming a supporting pad area. The patterning the dielectric layer further includes forming a conductive channel area, which includes a portion of the conductive channel area passing at least partially through the supporting pad area. At least one dielectric region interposes the portion of the conductive channel area and the supporting pad area. The supporting pad area and the conductive channel area are filled with a conductive material. The supporting pad area of the conductive material forms a supporting pad. The conductive channel area of the conductive material forms a conductive channel.

Although the present disclosure and advantages of some embodiments have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
    a die comprising a substrate;
    a connective layer disposed over the die, wherein the connective layer includes:
        a supporting pad;
        a conductive channel, wherein a portion of the conductive channel passes at least partially through an opening in the supporting pad in a first direction parallel to a top surface of the substrate, the opening extending from a first edge of the supporting pad to at least a point within the supporting pad; and
        at least one dielectric region interposed between the supporting pad and the portion of the conductive channel;
    an intermediate layer disposed over the connective layer; and
    a second connective layer disposed over the intermediate layer, wherein the second connective layer contains a landing pad.

2. The semiconductor device of claim 1, wherein the portion of the conductive channel passes completely through the opening in the supporting pad, the opening extending to a second edge of the supporting pad.

3. The semiconductor device of claim 1, further comprising:
    a bump structure disposed above the landing pad, wherein the bump structure includes a conductive bump.

4. The semiconductor device of claim 3, wherein the bump structure includes a bump contact region in direct physical contact with a top surface of the landing pad, wherein a center of the bump contact region is substantially aligned with a center of the supporting pad.

5. The semiconductor device of claim 4, wherein the bump contact region has an area of a size smaller than an area of a top surface of the supporting pad.

6. The semiconductor device of claim 3, wherein the bump structure includes an under-bump-metallization (UBM) layer disposed above the landing pad.

7. The semiconductor device of claim 3, wherein the landing pad in the second connective layer is electrically coupled to the conductive channel in the connective layer through a conductive via in the intermediate layer.

8. A semiconductor device, comprising:
    a die including a multilayer interconnect (MLI) structure, wherein the MLI structure includes a first conductive component and a second conductive component;
    a connective layer disposed over the die, wherein the connective layer includes a supporting pad, wherein the supporting pad is electrically connected to the first conductive component of the MLI structure, wherein the supporting pad has an opening extending from an edge of the supporting pad to a point within the supporting pad, wherein the opening includes
        a continuous conductive planar path, wherein the continuous conductive planar path is electrically connected to the second conductive component of the MLI structure; and
        at least one dielectric component interposed between the continuous conductive planar path and the supporting pad.

9. The semiconductor device of claim 8, wherein the point within the supporting pad is a second edge of the supporting pad.

10. The semiconductor device of claim 8, wherein the opening extends to a second point within the supporting pad to form an opening branch.

11. The semiconductor device of claim 8, further comprising:
    an intermediate layer formed over the connective layer;
    a second connective layer disposed over the intermediate layer, wherein the second connective layer includes a landing pad; and
    a bump structure disposed above the landing pad, wherein the bump structure includes a conductive bump, wherein the bump structure includes a bump contact region in direct physical contact with a top surface of the landing pad.

12. The semiconductor device of claim 11, wherein the bump contact region has an area of a smaller size than a top surface of the supporting pad.

13. The semiconductor device of claim 11, wherein a center of the bump contact region is substantially aligned with a center of the supporting pad.

14. The semiconductor device of claim 11, further comprising a Through-Substrate-Via (TSV) structure, wherein the landing pad is electrically connected to a second die using the TSV structure.

15. The semiconductor device of claim 11, wherein the landing pad is electrically connected to the continuous conductive planar path by a conductive via in the intermediate layer.

16. The semiconductor device of claim 11, wherein the landing pad is electrically connected to the supporting pad by a conductive via in the intermediate layer.

17. The semiconductor device of claim 11, wherein the MLI structure includes a third conductive component, and wherein the landing pad is electrically connected to the third conductive component.

18. A semiconductor device, comprising:
   a substrate including a first device and a second device;
   a first conductive pad disposed over the substrate and electrically connected to the first device;
   a second conductive pad disposed over the substrate and electrically connected to the second device;
   a passivation layer disposed over the first conductive pad and the second conductive pad, wherein a first portion of the first conductive pad is exposed in a first opening of the passivation layer, and a second portion of the second conductive pad is exposed in a second opening of the passivation layer;
   a connective layer disposed over the passivation layer, wherein the connective layer includes a supporting pad electrically connected to the first device through the first portion of the first conductive pad, wherein the supporting pad has an opening extending from an edge of the supporting pad to a point within the supporting pad, and wherein the opening includes
      a continuous conductive planar path electrically connected to the second device through the second portion of the second conductive pad; and
      at least one dielectric component interposed between the continuous conductive planar path and the supporting pad.

19. The semiconductor device of claim 18, wherein the point within the supporting pad is a second edge of the supporting pad.

20. The semiconductor device of claim 18, wherein the opening extends to a second point within the supporting pad to form an opening branch.

* * * * *